(12) United States Patent
Adachi et al.

(10) Patent No.: US 7,781,962 B2
(45) Date of Patent: Aug. 24, 2010

(54) ORGANIC LIGHT-EMITTING DEVICES AND DISPLAYS INCLUDING A POLARIZATION SEPARATOR, A PHASE PLATE, AND A POLARIZER

(75) Inventors: Masaya Adachi, Hitachi (JP); Yoshiyuki Kaneko, Hachioji (JP); Sukekazu Aratani, Hitachiota (JP); Shingo Ishihara, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/967,888

(22) Filed: Dec. 31, 2007

(65) Prior Publication Data
US 2008/0143253 A1 Jun. 19, 2008

Related U.S. Application Data

(63) Continuation of application No. 11/311,626, filed on Dec. 20, 2005, now Pat. No. 7,339,316, which is a continuation of application No. 10/814,639, filed on Apr. 1, 2004, now Pat. No. 7,012,365, which is a continuation of application No. 09/940,887, filed on Aug. 29, 2001, now abandoned.

(30) Foreign Application Priority Data
Jan. 15, 2001 (JP) .............................. 2001-006513

(51) Int. Cl.
*H01J 61/20* (2006.01)
*H05B 33/00* (2006.01)

(52) U.S. Cl. .................. 313/506; 313/504; 313/509; 313/113; 313/112; 349/96; 349/113

(58) Field of Classification Search ............... None
See application file for complete search history.

(56) References Cited

U.S. PATENT DOCUMENTS
5,587,816 A 12/1996 Gunjima et al.
(Continued)

FOREIGN PATENT DOCUMENTS
EP 0 823 831 A1 2/1998
(Continued)

OTHER PUBLICATIONS
Japanese Office Action for the Japanese Patent Application No. 2004101046742, Nov. 23, 2007.
(Continued)

*Primary Examiner*—Sikha Roy
(74) *Attorney, Agent, or Firm*—Dickstein Shapiro LLP

(57) ABSTRACT

Light-emitting devices (24) and light-emitting displays (1) for realizing bright display by allowing light emitted from an emissive layer (100) to efficiently contribute to a display. Polarization separators (500) are arranged between the emissive layer (100) and a phase plate (700). In the light of a wavelength range which includes a part or all of a light-emission wavelength range of the emissive layer and is narrower than a visible wavelength range and is directed from the emissive layer side to the polarization separators side, the polarization separators (500) reflect circularly polarized light components which are converted into linearly polarized light that is absorbed by the polarizer (600) due to the operation of the phase plate and transmit the other light.

8 Claims, 16 Drawing Sheets

U.S. PATENT DOCUMENTS

| | | | |
|---|---|---|---|
| 5,705,285 A | | 1/1998 | Shi et al. |
| 5,712,694 A | | 1/1998 | Taira et al. |
| 5,825,444 A | | 10/1998 | Broer et al. |
| 5,928,801 A | | 7/1999 | Broer et al. |
| 6,088,079 A | | 7/2000 | Kameyama et al. |
| 6,114,715 A | * | 9/2000 | Hamada .................. 257/72 |
| 6,118,504 A | | 9/2000 | Iijima et al. |
| 6,194,837 B1 | * | 2/2001 | Ozawa .................. 315/169.1 |
| 6,320,632 B1 | | 11/2001 | Nishimura et al. |
| 6,515,428 B1 | | 2/2003 | Yeh et al. |
| 6,566,156 B1 | | 5/2003 | Sturm et al. |
| 6,641,933 B1 | * | 11/2003 | Yamazaki et al. ........... 428/690 |
| 6,667,788 B1 | | 12/2003 | Maruyama et al. |
| 6,768,257 B1 | * | 7/2004 | Yamada et al. .............. 313/504 |
| 7,012,366 B2 | * | 3/2006 | Park et al. .................. 313/505 |
| 2002/0047567 A1 | * | 4/2002 | Fujita et al. .............. 315/169.3 |
| 2003/0165060 A1 | | 9/2003 | Ouderkirk et al. |

FOREIGN PATENT DOCUMENTS

| | | |
|---|---|---|
| EP | 0 989 778 | 3/2000 |
| EP | 1 058 314 A2 | 12/2000 |
| JP | A-11-45058 | 6/1989 |
| JP | 8-509834 | 10/1996 |
| JP | 9-127885 | 5/1997 |
| JP | 9-511844 | 11/1997 |
| JP | 2000-113988 | 4/2000 |
| JP | 2000-14726 | 5/2000 |
| JP | 2000 195673 | 7/2000 |
| JP | 2000-356769 | 12/2000 |
| JP | 2001-006513 | 1/2001 |
| JP | A-2001-244068 | 9/2001 |
| JP | A-2001-244080 | 9/2001 |
| JP | A-2001-311826 | 11/2001 |
| JP | A-2001-357979 | 12/2001 |
| JP | A-2003-115383 | 4/2003 |
| WO | WO-97/12276 | 4/1997 |

OTHER PUBLICATIONS

Jurg Fuenfschilling, et al., "The Efficient Optics of Liquid Crystal Polarized Color Projection," 8351 Optoelectronics Devices and Technologies, Mita Press, (Dec. 1992), No. 2, Tokyo, JP.

"23.3: Retroreflecting Sheet Polarizer" by M.F. Weber, SID 92 Digest, pp. 427-429.

"26.1: Cholesteric Reflectors with a Color Pattern" by R. Maurer, et al., SID 94 Digest, pp. 399-402.

"Organic LED full-color passive-matrix display" by Satoshi Miyaguchi, et al., Journal of the SID 7/3, 1999, pp. 221-223.

The Journal of the institute of information and television engineers, vol. 54, No. 8, pp. 1115-1120.

Technique of Liquid Crystal Display of Next generation, Tatsuo Uchida, Kogyo Chosakai Publishing Co., Ltd.

* cited by examiner

ORGANIC LIGHT-EMITTING DEVICES AND DISPLAYS INCLUDING A POLARIZATION SEPARATOR, A PHASE PLATE, AND A POLARIZER

CROSS-REFERENCE TO RELATED APPLICATION

This application is a continuation of U.S. application Ser. No. 11/311,626, filed Dec. 20, 2005, which is a continuation of U.S. application Ser. No. 10/814,639, filed Apr. 1, 2004, now U.S. Pat. No. 7,012,365, issued Mar. 14, 2006, which is a continuation of application Ser. No. 09/940,887, filed Aug. 29, 2001, the entire disclosures of which are incorporated by reference herein.

BACKGROUND OF THE INVENTION

The invention relates to light-emitting devices and light-emitting displays for controlling the light-emitting operations of the light-emitting devices and displaying. More particularly, the invention relates to light-emitting devices such as organic electroluminescence devices having light reflective elements on the back side of an emissive layer and to a technique which is effective when it is used for displays having such light-emitting devices.

An organic electroluminescence device (hereinafter, referred to as an organic EL device) is a device such that by injecting electrons into an emissive layer comprising an organic thin film, an electric energy is converted into a light energy and light is emitted. Unlike a light-emitting display of the non-emissive type represented by a liquid crystal display, since the light-emitting display constructed by the organic EL devices is a self-emissive type, an auxiliary light source such as a back light or the like is unnecessary. Thus, there is a feature such that it is thin and light-weighted, further, a viewing angle is wide, and a response time of display is short.

FIG. 19 is a schematic cross sectional view showing an example of a conventional organic EL device. The organic EL device has a structure such that transparent electrodes 200 serving as an anode, a hole transporting layer 102, an emissive layer 100, an electron transporting layer 101, and a cathode 300 comprising metal electrodes having a light reflecting function are sequentially deposited onto a transparent substrate 400.

When a DC voltage is applied between the transparent electrodes 200 as an anode and the cathode 300, holes injected from the transparent electrodes 200 reach the emissive layer 100 via the hole transporting layer 102, electrons injected from the cathode 300 reach the emissive layer 100 via the electron transporting layer 101, and the electrons and the holes are recombined, so that a light emission having a predetermined wavelength distribution is generated from the recombination region.

In light emitted from the emissive layer 100, the light directing toward the transparent electrodes 200 side passes through the transparent electrodes 200 and is emitted from the transparent substrate 400. The light directing toward the cathode 300 is reflected by the cathode 300, passes through the emissive layer 100, transparent electrodes 200, and the like, and is emitted likewise from the transparent substrate 400.

Therefore, in the display for performing the display by controlling the light-emitting operation of such organic EL devices as mentioned above, a structure such that the cathode is set to an electrode having high reflectance and an amount of light which is emitted from the transparent electrodes side is increased is important in order to obtain a bright image.

According to such a device structure, in a state where no light emission is emitted, since the cathode is in a state like a mirror having high reflectance, an ambient scenery and the like enter, so that a black (dark) display does not sufficiently become dark. That is, there is a problem such that the black display does not become dark under an environment where the ambience is bright, and a contrast ratio decreases. As a method of solving such a problem, a structure such that a circular polarizer 800 is arranged on the light-emitting surface side of the transparent substrate 400 has been put into practical use. The circular polarizer comprises a polarizer 600 and a quarter-wave plate 700.

The circular polarizer 800 operates as follows. An external light 2000 incoming from the ambience into the organic EL devices is generally an unpolarized light. When the light passes through the polarizer 600, a specific linearly polarized light is transmitted and a linearly polarized light which crosses perpendicularly thereto is absorbed. The linearly polarized light transmitted through the polarizer 600 is subjected to an operation of the quarter-wave plate 700 and becomes a circularly polarized light (for example, dextrorotatory circularly polarized light here). When the light which passed through the quarter-wave plate 700 is reflected by the cathode 300, it becomes a circularly polarized light (levorotatory circularly polarized light) whose phase is shifted by $\pi$ and whose rotational direction is opposite. A light 2000R reflected by the cathode 300 is incoming again into the quarter-wave plate 700. When the light passes therethrough, it is subjected to its operation, converted into the linearly polarized light which is absorbed by the polarizer 600, and absorbed by the polarizer 600, so that it is not returned to the outside. That is, since the external light (incident ambient light) reflected by the cathode 300 is cut, the black display becomes dark and the contrast ratio is remarkably improved.

Such a structure has been disclosed in JP-A-8-509834, JP-A-9-127885, and the like.

Several systems have been proposed and verified with respect to a technique for realizing a full-color image of a display using organic EL devices. For example, the following systems have been proposed: that is, a system in which blue light-emitting devices and a fluorescent CCM (Color-Changing Mediums) are combined (hereinafter, referred to as a CCM method); a system in which a white light emission and color filters of three primary colors of red (R), green (G), and blue (B) are combined (hereinafter, referred to as an RGB-by-white method); a system in which pixels comprising light-emitting devices of three primary colors (R, G, B) are directly patterned (hereinafter, referred to as a direct-patterning approach); and the like.

According to the CCM method, a fluorescent color changing fluorescent dye medius is excited by the light generated in a blue emissive layer and the light is changed from blue to green and red, thereby obtaining 3-primary color light emission. According to this system, if color changing efficiency is low, device efficiency deteriorates. Under a further bright environment, the color-changing mediums is excited by the incident ambient light and becomes bright and the black display is not darkened, so that a contrast ratio deteriorates.

Although the RGB-by-white method has a feature such that the manufacturing is the easiest because light-emitting devices of only one kind of white are formed, since the color filter is used, using efficiency of the light deteriorates to ⅓ or less in principle.

According to the direct-patterning approach, since it is necessary to form three kinds of devices onto the same substrate, the manufacturing process becomes slightly complicated. However, a loss of light is minimum and the above system is an ideal system from a viewpoint of light emitting efficiency. With respect to the patterning of the RGB, in case of using a material of what is called a small molecules such as fluorescent dye, metalcomplexes, or the like whose molecular weight is small, a technique for finely patterning the RGB by a vacuum evaporation deposition of an organic layer using a shadow mask has been proposed.

In case of using a polymeric material such as π-conjugated polymers, dye-containing polymers, or the like, there has been proposed a technique such that by forming banks of polyimide by photo-etching, a pixel area is separated and an organic material is printed by an ink-jet technology, thereby finely patterning the RGB (the journal of the institute of information and television engineers, Vol. 54, No. 8, pp. 1115 to 1120).

According to the conventional techniques having the circular polarizer, since the incident ambient light reflection by electrodes (cathode) having a light reflecting function of organic EL devices can be reduced by the operation of the circular polarizer, a high contrast ratio can be realized even under the bright environment. However, upon light emission, since a part of the light emitted from the emissive layer is absorbed by the circular polarizer, there is a problem such that the display becomes dark. This is because, since the light emitted from the emissive layer is generally unpolarized light, the light of at least ½ is absorbed by the polarizer constructing the circular polarizer.

In case of realizing the full-color light-emitting displays by the organic EL devices, the direct-patterning approach is most preferable from a viewpoint of the device efficiency. However, in case of the present organic EL devices, a wavelength range of the light emission is broad in dependence on the color and color purity is not high. Although there is a method of further using color filters in order to raise the color purity of each primary color, in this case, since the light is absorbed by the color filters, the using efficiency of the light deteriorates and the display becomes dark.

SUMMARY OF THE INVENTION

The invention is made in consideration of the above problems, it is an object of the invention to provide light-emitting devices such as organic EL devices or the like in which by allowing light emitted from an emissive layer to efficiently contribute to a display, the bright display is realized and, at the same time, by reducing the reflection of incident ambient light by reflective elements such as electrodes or the like on the back side of the emissive layer, the display of a high contrast ratio is realized even under the bright environment and to provide light-emitting displays for displaying by controlling the light emitting operations of the light-emitting devices.

Further, another object of the invention is to provide light-emitting devices having a enhanced color purity without losing brightness and to provide light-emitting displays for displaying by controlling the light emitting operations of the light-emitting devices. Other objects of the invention will be clarified by the following description.

To accomplish the above objects, according to light-emitting devices of the present invention, polarization separators (cholesteric liquid crystal layers) are arranged between an emissive layer and a phase plate. In light in a wavelength range which includes a part or all of a light-emitting wavelength range of the emissive layer and is narrower than a visible wavelength range, that is, in light which directs from the emissive layer side to the polarization separators side, the polarization separators reflect circularly polarized components which are converted to the linearly polarized light that is absorbed by the polarizer due to the operation of the phase plate and transmits the other light.

Reflective elements locating on the back side of the emissive layer are a reflecting surface for reflecting at least the circularly polarized light at normal incidence as circularly polarized light whose rotating direction is opposite.

In the light emitted from the emissive layer, the polarized light components which have conventionally been absorbed by the polarizer are reflected by the polarization separators before they are absorbed by the polarizer, and are directed toward the reflective elements.

The light which was reflected by the polarization separators and is directed toward the reflective elements is the circularly polarized light and becomes the circularly polarized light which is transmitted through the polarization separators by the reflection by the reflective elements, that is, the circularly polarized light which is converted into the linearly polarized light which is transmitted through the polarizer due to the operation of the phase plate, so that such light is used without being absorbed by the polarizer.

That is, the light which was emitted from the emissive layer, absorbed by the polarizer, and becomes wasteful hitherto is reflected by the polarization separators and used again before it is absorbed by the polarizer, so that the light-emitting devices can be made bright.

That is, to accomplish the above objects, according to the invention, there are provided light-emitting devices having an emissive layer and light reflective elements arranged on the back side of the emissive layer, wherein polarization separators for separating light in a predetermined wavelength range corresponding to light which is emitted from the emissive layer into two kinds of circularly polarized light components by reflection and transmission, a phase plate, and a polarizer are arranged on the front side of the emissive layer.

For example, cholesteric liquid crystal layers can be used as polarization separators. In this instance, a wavelength range of the selective reflection of the cholesteric liquid crystal layers are set to be equal to or narrower than the light-emitting wavelength range of the emissive layer. A quarter-wave plate is used as a phase plate.

According to the light-emitting devices of the above structure, the light emitted from the emissive layer is directly incoming into the cholesteric liquid crystal layers constructing the polarization separators or it is reflected by the reflective elements arranged on the back side of the emissive layer and is incoming into them. As for the light which was incoming into the cholesteric liquid crystal layers, the circularly polarized light components in one rotating direction (for example, levorotatory circularly polarized light here) are reflected and the circularly polarized light components in the direction opposite to the above rotating direction (dextrorotatory circularly polarized light) are transmitted due to the selective reflection of the cholesteric liquid crystal. The light transmitted through the cholesteric liquid crystal layers is converted from the circularly polarized light into the linearly polarized light due to the operation of the phase plate, transmitted without being absorbed by the polarizer, and directed toward the viewer.

The light reflected by the cholesteric liquid crystal layers is reflected by the reflective elements on the back side of the emissive layer and directed again toward the cholesteric liquid crystal layers. However, when it is reflected by the reflective elements, the phase is shifted by π and the reflected light becomes the circularly polarized light in the direction opposite to the above rotating direction (dextrorotatory circularly polarized light). Therefore, the light is transmitted in the cholesteric liquid crystal layers and converted into the linearly polarized light which is transmitted through the polarizer due to the operation of the phase plate and, thereafter, it is transmitted through the polarizer and directed toward the viewer. That is, the light which has conventionally been absorbed by the polarizer and has become wasteful is reflected by the polarization separators (cholesteric liquid crystal layers) before it is absorbed by the polarizer and used again, so that the light-emitting devices can be made bright.

Further, if the wavelength range of the light which is reflected by the polarization separators (cholesteric liquid crystal layers) and used again is narrower than the light-emitting wavelength range of the emissive layer, the wavelength distribution of the light which is actually emitted from the devices is narrower and steeper than the light-emitting wavelength distribution of the emissive layer, so that the color light of a color purity higher than that of the light emission itself of the emissive layer is obtained.

Since the ambient light that enters the light-emitting devices under the bright environment is generally the unpolarized light, when it passes through the polarizer, at least the half of it is absorbed. When the light passing through the polarizer is transmitted through the phase plate, it is subjected to the operation thereof, becomes the circularly polarized light (for example, dextrorotatory circularly polarized light) and is transmitted through cholesteric liquid crystal layers. When the light transmitted through the cholesteric liquid crystal layers is reflected by the reflective elements, it becomes the circularly polarized light (levorotatory circularly polarized light) in the direction opposite to the above rotating direction and is incoming into the cholesteric liquid crystal layers again. In the light which was incoming into the cholesteric liquid crystal layers, the light of the wavelength other than the selective reflection wavelength is transmitted as it is, is subjected to the operation of the phase plate, becomes the linearly polarized light which is absorbed by the polarizer, and is absorbed by the polarizer, so that it is not transmitted to the outside.

On the other hand, the light of the wavelength corresponding to the selective reflection wavelength is reflected by the cholesteric liquid crystal layers and reflected again also by the reflective elements. After that, it passes through the cholesteric liquid crystal layers, phase plate, and polarizer and is emitted outside. Since this light is very small, even under the bright environment, the black (dark) display becomes dark and a high contrast ratio can be realized.

DESCRIPTION OF THE EMBODIMENTS

Figure 1:
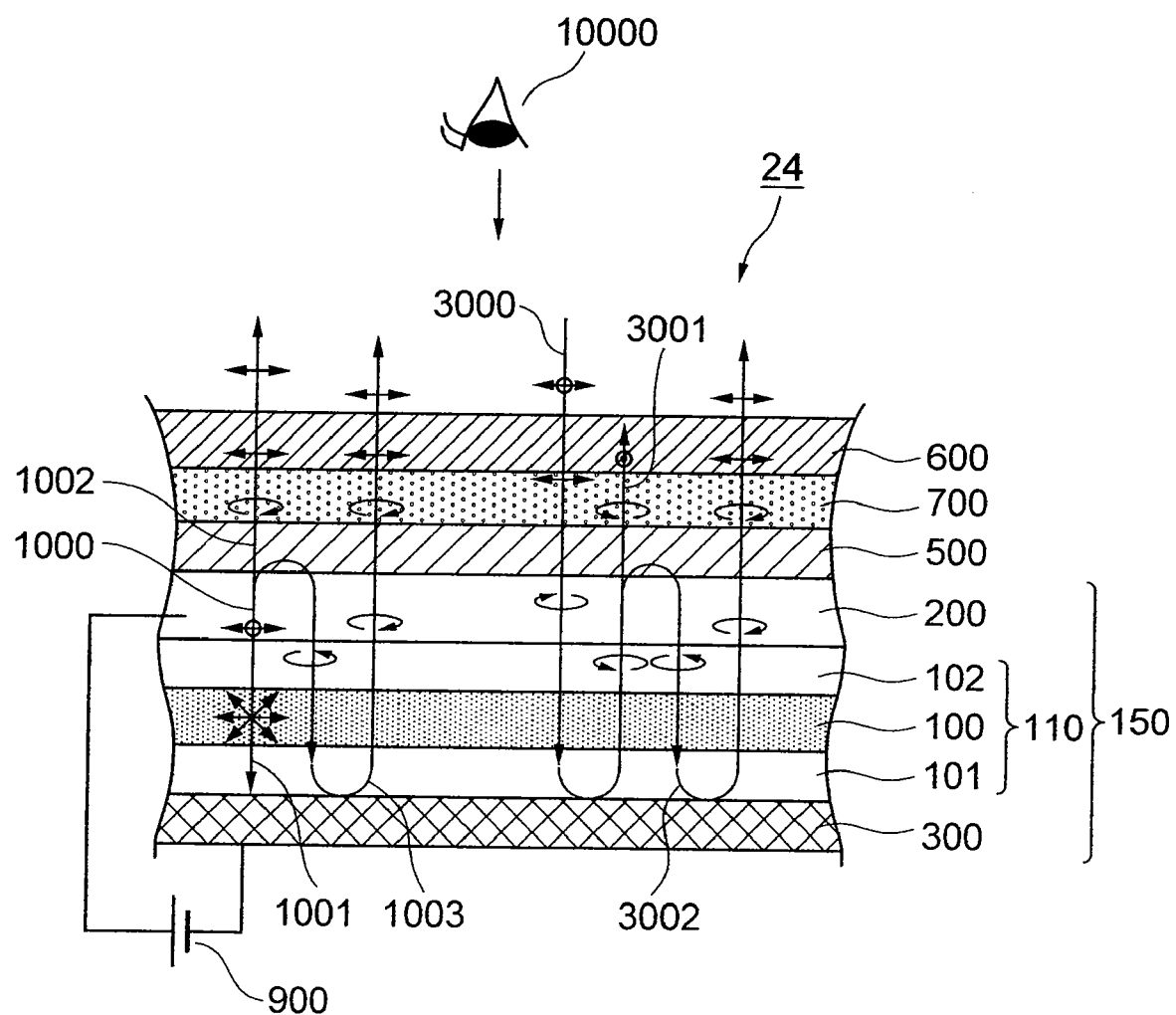
FIG. 1 is a schematic cross sectional view showing a part of light-emitting devices according to an embodiment of the invention.

A specific embodiment of the invention will now be described hereinbelow with reference to the drawings. FIG. 1 is a schematic cross sectional view for explaining a fundamental construction and an operation principle of light-emitting device of the invention. As shown in FIG. 1, a light-emitting device 24 according to the invention is constructed by: an organic EL device 150 which is formed on a substrate (not shown) and comprises an anode made of the transparent electrodes 200, the cathode 300 serving as specular reflection means, and an organic layer 110 formed between the anode and the cathode; polarization separators 500 sequentially arranged on the transparent electrodes 200 side of the organic EL device 150; the phase plate 700; and the polarizer 600.

As an organic layer 110 of the organic EL device 150, it is possible to use a layer such that the electron transporting layer 101, emissive layer 100, and hole transporting layer 102 are deposited and arranged between the anode (transparent electrodes 200) and cathode 300 in order from the cathode 300 side.

By using a material which can be used in common for the emissive layer 100 and electron transporting layer 101, they can be also constructed by one layer. As a structure of the organic EL devices 150, it is also possible to use another structure such that an anode buffer layer is arranged between the anode (transparent electrodes 200) and hole transporting layer 102. CuPc can be used as an anode buffer layer. It is considered that CuPc plays a role of improvement of contact between the anode and the hole transporting layer.

It is sufficient to use a transparent electrode material of a high work function as an anode (transparent electrodes 200) and, for example, ITO (Indium tin oxide) is preferable. In future, InZnO will be able to be used.

Al, Mg, Mg—Ag alloys, Al—Li alloys, etc. of a low work function can be used as a cathode 300. According to sole Al, since a driving voltage is high and a lifetime is short, it is also possible to use a material having characteristics matched with those of Al—Li alloys by inserting a very thin Li compound (lithium oxide $Li_2O$, lithium fluoride LiF, etc.) between the organic layers.

It is also possible to reduce the driving voltage by doping a metal having a high response speed such as lithium, strontium, or the like into the organic layer in the portion which is in contact with the cathode. It is desirable that the cathode 300 is made of a material having high reflectance of light from a viewpoint of improvement of using efficiency of the light emitted from the emissive layer.

Further, from the reasons which will be explained hereinlater, it is desirable that the cathode 300 has a mirror surface for reflecting at least the circularly polarized light at normal incidence as a circularly polarized light whose rotating direction is opposite from viewpoints of the reduction of the incident ambient light reflection and the improvement of the using efficiency of the light emitted from the emissive layer.

The organic layer 110 uses a material which emits light in desired color when a predetermined voltage is applied between the anode (transparent electrodes 200) and cathode 300.

As a material for emitting red light, for example, the hole transporting layer 102 can use α-NPD (4,4'-bis[N-(1-naphthyl)-N-phenylamino] biphenyl) or triphenyldiamine derivatives TPD (N,N'-bis(3-methylphenyl)-N,N'-diphenyl-[1,1'-biphenyl]-4,4'-diamine), and the electron transporting emissive layer (the electron transporting layer 101 and emissive layer 100 are used in common) can use a material obtained by dispersing DCM-1 (4-dicyanomethylene-6-(p-dimethylaminostyryl)-2-methyl-4-H-pyran into Alq3 (tris(8-quinolinolate) aluminum).

As a material for emitting green light, for example, the hole transporting layer 102 can use α-NPD or triphenyldiamine derivatives TPD, and the electron transporting emissive layer (the electron transporting layer 101 and emissive layer 100 are used in common) can use Alq3, Bebq (bis(8-hydroxy quinolinate) beryllium), or Alq3 doped with quinacridone.

As a material for emitting blue light, for example, the hole transporting layer 102 can use α-NPD or triphenyldiamine derivatives TPD, the emissive layer 100 can use DPVBi (4,4'-bis(2,2-diphenylvinyl) biphenyl), a material comprising DPVBi and BCzVBi (4,4'-bis(2-carbozolevinylene) biphenyl), or a material obtained by distyrylallylene derivatives as hosts and doping distyrylamine derivatives as guests, and the electron transporting layer 102 can use Alq3.

As an electron transporting emissive layer (the electron transporting layer 101 and emissive layer 100 are used in common), a zinc complex of Zn(oxz)2 (2-(o-hydroxyphenyl) benzoxazole) can be used.

Further, polymeric materials other than the small molecular materials can be used. As polymeric materials, a deposited layer of PEDT/PSS (Polyethylene dioxythiophene/polystyrene sulphonate) and PPV (Poly(p-phenylene) vinylen) can be used as a hole transporting layer 102 and an emissive layer 100. The light emission of green can be realized by a material obtained by mixing green ink into PPV. The light emission of red can be realized by a material obtained by adding and mixing Rhodamine 101 as red light-emitting dopant into green ink. F8 (Poly(dioctylfluorene) can be used as a blue emissive layer. F8 also functions as an electron transporting layer 101.

As another polymeric material, a dye contained polymer like PVK (poly(N-vinylcarbazole)) can be used.

Each layer constructing the organic layer 110 is thin and has a thickness of about tens of nm. A polarizing state of the light which is transmitted through this layer is almost maintained.

In the organic EL device 150 constructed by the above materials, a DC power source 900 is connected between the transparent electrodes 200 as an anode and the cathode 300. It is considered that by applying a DC voltage between the transparent electrodes 200 and cathode 300, the holes injected from the transparent electrodes 200 reach the emissive layer via the hole transporting layer 102, the electrons injected from the cathode 300 reach the emissive layer via the electron transporting layer 101, a recombination of the electrons and holes occurs, and the light emission of a predetermined wavelength is caused from the recombined portion.

The polarization separators 500, phase plate 700, and polarizer 600 are sequentially stacked and arranged on the side of the transparent electrodes 200 opposite to the organic layer 110. The polarization separators 500 have a function for separating the light in a predetermined wavelength range into two kinds of circularly polarized light components by the reflection and transmission. The cholesteric liquid crystal layer is suitable as polarization separators 500.

The cholesteric liquid crystal layer show unique optical characteristics based on a helical molecular array. The light which was incoming in parallel with a helical axis shows the selective reflection such that the circularly polarized light components in one rotating direction are reflected and those in the other direction are transmitted in accordance with the helical pitch direction at a wavelength corresponding to a pitch of a cholesteric helix.

A center wavelength $\lambda_o$ of the selective reflection by the cholesteric liquid crystal layer and its wavelength range $\Delta\lambda$ are expressed by the following equations (1) and (2), respectively.

$$\lambda_o = n_m \cdot p \quad (1)$$

$$\Delta\lambda = \Delta n \cdot p \quad (2)$$

where,
p: helical pitch of the cholesteric liquid crystal layer
$n_m$: average refractive index of the liquid crystal
$\Delta n$: birefringence of the liquid crystal Assuming that refractive indices in the directions which are parallel and perpendicular to the major axis of liquid crystal molecules are set to $n_e$ and $n_o$, respectively, $n_m$ and $\Delta n$ are expressed by the following equations (3) and (4).

$$n_m = ((n_e^2 + n_o^2)/2) \quad (3)$$

$$\Delta n = n_e - n_o \quad (4)$$

For example, in case of aligning and arranging a plurality of light-emitting devices 24, controlling the light-emitting operations of them, and realizing a light-emitting display for performing a full-color display, it is desirable to set a peak wavelength (wavelength at which the maximum intensity is obtained) of the light emission of the organic EL devices 150 constructing the light-emitting devices 24 to wavelengths corresponding to three primary colors of red (R), green (G), and blue (B). That is, the peak wavelength of the light emission of the organic EL devices 150 is made different every pixel in correspondence to three primary colors. In correspondence to it, the wavelength range of the selective reflection of the cholesteric liquid crystal layer or the center wavelength $\lambda_o$ of the selective reflection is made to correspond to the light-emitting wavelength range of the organic EL device 150 or the peak wavelength of the light emission (of the organic EL device).

Figure 2:
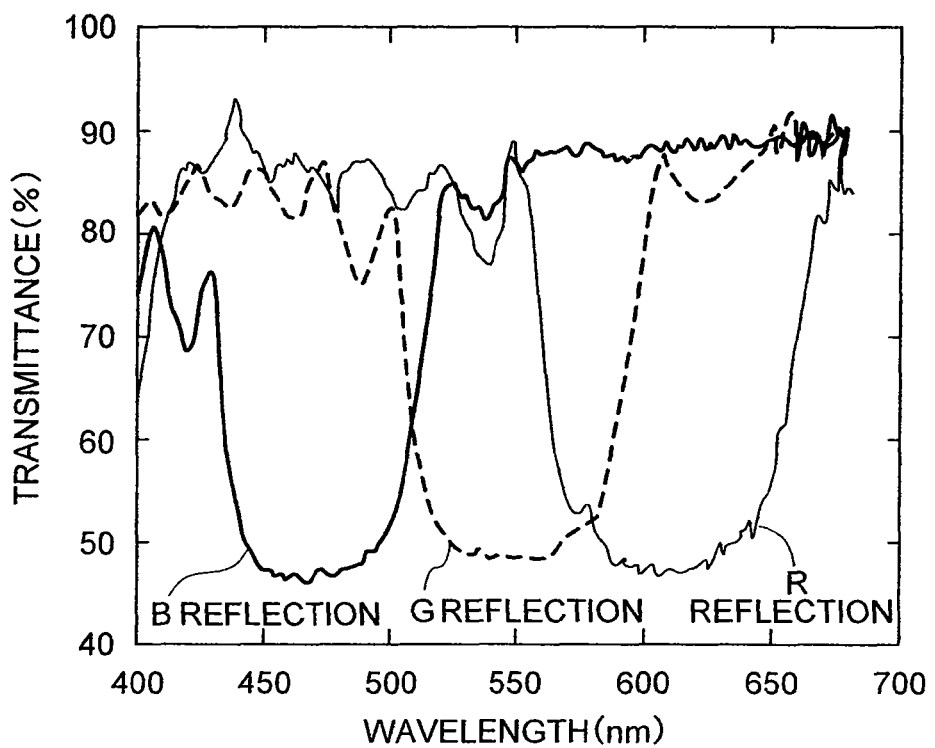
FIG. 2 is a graph showing an example of transmissive spectra of cholesteric liquid crystal layers according to the light-emitting devices of the embodiment of the invention.

FIG. 2 is a graph showing wavelength dependency of transmittance in the cholesteric liquid crystal layer in the case where, for example, the unpolarized light is incoming into the cholesteric liquid crystal layer. An example of the selective reflection corresponding to three primary colors of R, G, and B is shown, respectively.

For example, in the case where the light-emitting color of the organic EL device 150 is blue, it is sufficient to arrange the cholesteric liquid crystal layer showing the characteristics of the B reflection shown in FIG. 2 as polarization separators 500. That is, it is sufficient to construct the polarization separators 500 by cholesteric liquid crystal layers having the wavelength range of the selective reflection corresponding to the light-emitting color of the organic EL device 150.

In the conventional technique, the phase plate 700 and polarizer 600 construct what is called a circular polarizer. That is, the polarizer 600 transmits the specific linearly polarized light in the light which passes through it and absorbs the linearly polarized light which perpendicularly crosses it.

As a phase plate 700, a plate which functions as a quarter-wave plate for converting the linearly polarized light which passed through the polarizer 600 into the circularly polarized light is used. As a polarizer 600, it is possible to use a polarizer obtained by absorbing iodine into drawn polyvinyl-alcohol and forming protecting layers of triacetyl-cellulose onto both sides of the polyvinylalcohol layer to which a polarizing function has been applied.

The phase plate 700 can use a transparent uniaxial oriented polymer film such as polyvinyl alcohol, polycarbonate, polysulfone, polystyrene, polyarylate, or the like. Since the transparent member constructing the phase plate generally has wavelength dependency of a refractive index, sufficient performance cannot be obtained in case of using one kind of phase plate with respect to the light in a wide wavelength range like ambient light such as solar light, illumination light, or the like. Therefore, it is also possible to construct a phase plate which functions as a quarter-wave plate in a wide wavelength range by adhering two kinds of phase films of different wavelength dependency of a refractive index while their optical axes are shifted from each other.

It is important to decide the direction of a slow axis of the phase plate 700 in a manner such that the circularly polarized light of the light which through the polarizer 600 and passed through the phase plate 700 becomes the circularly polarized light for example (dextrorotatory circularly polarized light) whose rotating direction is opposite to that of the circularly polarized light (for example, levorotatory circularly polarized light) in which the cholesteric liquid crystal layers constructing the polarization separators 500 show the selective reflection.

The operation of the light-emitting devices will now be described with reference to FIG. 1.

When the DC power source 900 is connected to the transparent electrodes 200 and cathode 300 and a current is supplied, light of a predetermined wavelength is emitted from the emissive layer 100. In the light emitted from the emissive layer 100, light 1000 which was directed toward the transparent electrodes 200 side is transmitted through the transparent electrodes 200 as it is and is incoming into the polarization separators 500. In the light emitted from the emissive layer 100, light 1001 which was directed toward the cathode 300 side is reflected by the cathode 300 and, thereafter, is transmitted through the transparent electrodes 200 and is incoming into the polarization separators 500.

In this instance, since the light emitted from the emissive layer 100 is the unpolarized light, in the light which is incoming into the polarization separators 500, the circularly polarized light components in one rotating direction (for example, dextrorotatory circularly polarized light here) are transmitted and the circularly polarized light components in the opposite rotating direction (levorotatory circularly polarized light) are reflected due to the selective reflection of the cholesteric liquid crystal layers constructing the polarization separators 500.

Light 1002 transmitted through the polarization separators 500 is converted into the linearly polarized light which is transmitted through the polarizer 600 due to the operation of the phase plate 700, transmitted through the polarizer 600, and directed toward an viewer 10000.

On the other hand, light 1003 which was reflected by the polarization separators 500 is reflected by the cathode 300 and directed toward the polarization separators 500. However, upon reflection by the cathode 300, the phase is shifted by $\pi$ and the light 1003 becomes the circularly polarized light in the opposite rotating direction (dextrorotatory circularly polarized light), so that it is transmitted through the polarization separators 500. The light 1003 transmitted through the polarization separators 500 is converted into the linearly polarized light which is transmitted through the polarizer 600 due to the operation of the phase plate 700, transmitted through the polarizer 600, and directed toward the viewer 10000.

The light emitted from the emissive layer 100, therefore, is directed toward the observer 10000 without almost being absorbed by the polarizer. That is, by effectively reusing the light which has conventionally been absorbed by the polarizer and become wasteful, there is an effect such that luminance of the light-emitting devices is improved. As a light extracting method, since the light 1002 transmitted through the polarization separators 500 and the light 1003 reflected by the polarization separators 500 can be extracted, high using efficiency of the light is obtained.

The external light which is incoming into the light-emitting devices 24 from the ambience under the bright environment will now be described. External light (incident ambient light) 3000 which is incoming into the light-emitting devices 24 from the ambience is generally the unpolarized light. However, when the light 3000 passes through the polarizer 600, a predetermined linearly polarized light is absorbed and the linearly polarized light whose linear polarization direction crosses perpendicularly to the absorbed light is transmitted. The linearly polarized light transmitted through the polarizer 600 is subjected to the operation of the phase plate 700 and becomes the circularly polarized light (for example, dextrorotatory circularly polarized light here).

The light which passed through the phase plate 700 is transmitted through the polarization separators 500 and, when it is reflected by the cathode 300, the phase is shifted by $\pi$ and the light becomes the circularly polarized light (levorotatory circularly polarized light) in the opposite rotating direction. The light reflected by the cathode 300 is incoming into the polarization separators 500. However, light 3001 of a wavelength out of the wavelength range of the selective reflection in the cholesteric liquid crystal layers constructing the polarization separators 500 is transmitted as it is. The light of the wavelength corresponding to the wavelength range of the selective reflection is reflected. The light (levorotatory circularly polarized light) transmitted through the polarization separators 500 is subjected to the operation of the phase plate 700, becomes the linearly polarized light which is absorbed by the polarizer 600, and absorbed by the polarizer 600, so that it is not returned to the outside.

Light 3002 reflected by the polarization separators 500 is reflected by the cathode 300, and directed toward the polarization separators 500 again. However, upon reflection by the cathode 300, the phase is shifted by πand the light becomes the circularly polarized light (dextrorotatory circularly polarized light) in the opposite rotating direction, so that the light is transmitted through the polarization separators 500. The light 3002 (dextrorotatory circularly polarized light) transmitted through the polarization separators 500 is converted into the linearly polarized light which is transmitted through the polarizer 600 by the operation of the phase plate 700, transmitted through the polarizer 600, and directed toward the viewer 10000.

That is, in the incident ambient light 3000, at least the half of it is first absorbed by the polarizer 600. Further, the light transmitted through the polarizer 600 is reflected by the cathode 300 and is incoming into the polarization separators 500. However, the light 3001 transmitted through the polarization separators 500 in such light is absorbed by the polarizer 600. Therefore, the light which is emitted outside is only the slight light 3002 corresponding to the wavelength range of the selective reflection of the polarization separators 500.

That is, according to the light-emitting devices of the invention, even under the bright environment, since most of the incident ambient light is cut, the black display becomes dark, and there is an effect such that a high contrast ratio can be realized.

As shown in an example in FIG. 2, a wavelength distribution of the selective reflection of the cholesteric liquid crystal layers constructing the polarization separators 500 generally shows a narrow peak band. The wavelength range of the selective reflection can be set to be narrower than the wavelength range of the light emission of the organic EL devices by helical pitch p and Δn of the liquid crystal which is used.

Generally, even if the center wavelength of the light emission is the same, when the light-emitting wavelength range is broad and the wavelength distribution is gentle, the color purity (excitation purity here, ratio of a distance from a white light source on a chromaticity diagram) is low. Therefore, if the wavelength range of the light which is reflected by the polarization separators 500 and reused is set to a peak band narrower than the light-emitting wavelength range of the emissive layer, the wavelength distribution of the light which is actually emitted from the devices is narrower and steeper than the light-emitting wavelength range of the emissive layer, so that the color purity can be set to be higher than that of the light emission from the emissive layer.

That is, according to the light-emitting devices of the invention, there is an effect such that the color purity can be set to be higher than that of the light emission of the organic EL devices 150 themselves by an amount of the light which is reflected by the polarization separators 500 and reused.

In case of the light-emitting displays such that a plurality of light-emitting devices are aligned and arranged, the light-emitting operation of each light-emitting device is controlled, and the display is performed, by enhancement of each color purity of the light-emitting devices corresponding to the three primary colors of R, G, and B, there is also an effect such that the light-emitting displays of a wide color gamut can be realized.

Further, if the wavelength range of the selective reflection of the cholesteric liquid crystal layers constructing the polarization separators 500 is narrower, the reflection of the incident ambient light under the bright environment is small, so that there is an effect such that a high contrast ratio is obtained.

Figure 3:
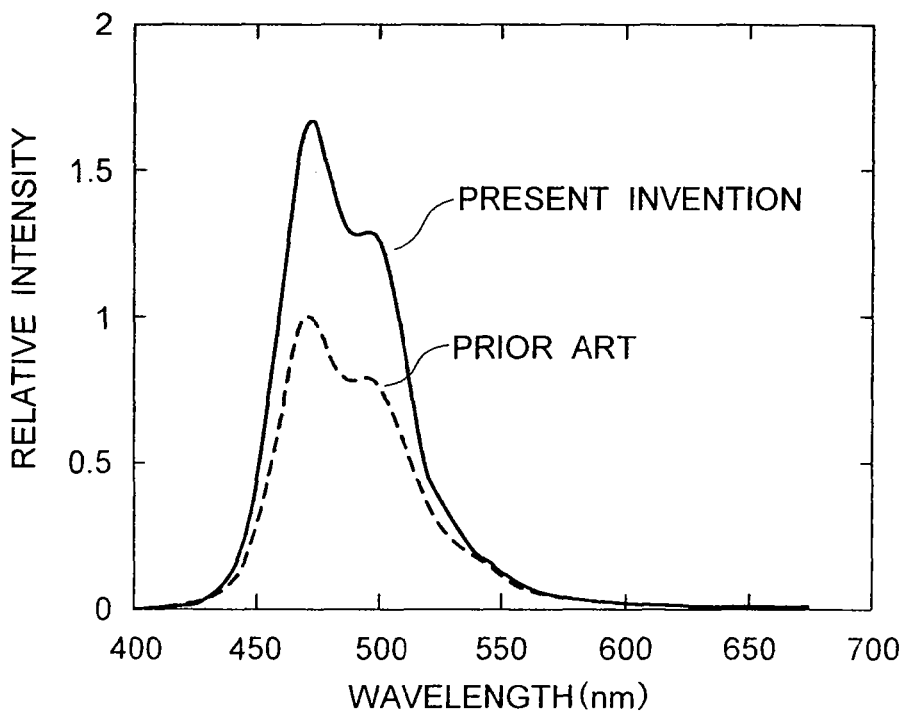
FIG. 3 is a graph showing an example of a relation between a relative intensity and a wavelength of light in the light-emitting devices of the embodiment of the invention.
Figure 4:
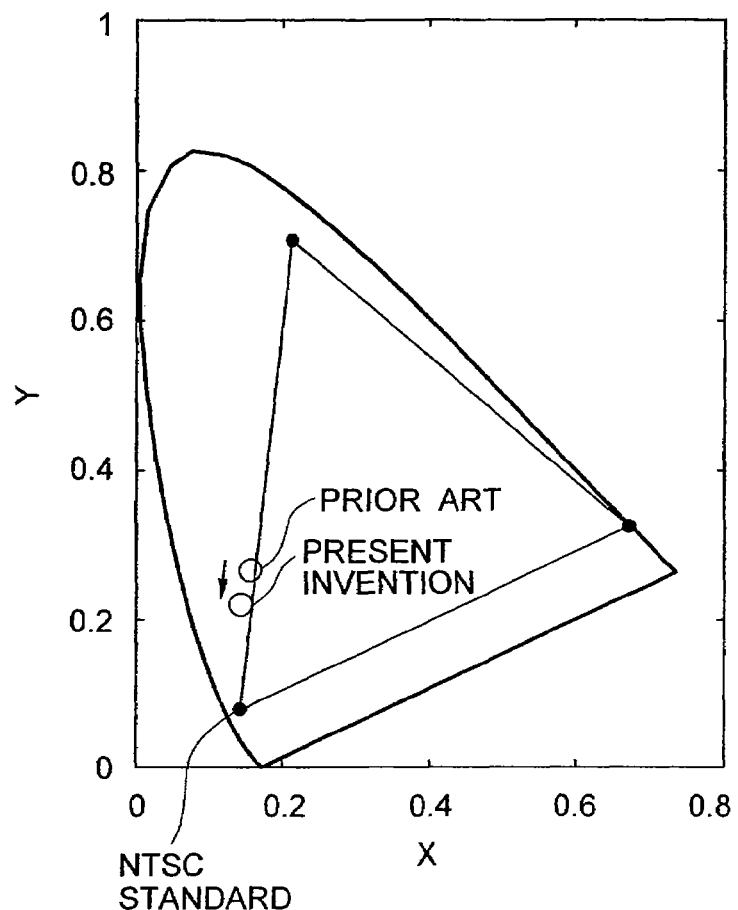
FIG. 4 is a CIE chromaticity diagram showing an example of CIE chromaticity coordinates in the light-emitting devices of the embodiment of the invention.

FIGS. 3 and 4 are a graph showing a relation between relative intensity and a wavelength of the light emitted from the light-emitting devices according to the invention and a CIE chromaticity diagram showing CIE chromaticity coordinates, respectively. The diagram shows an effect which is obtained in the case where in the organic EL devices 150 of blue light emission, the cholesteric liquid crystal layers having a wavelength range (B reflection) of the selective reflection in the wavelength of the blue light shown in the example in FIG. 2 are used as polarization separators 500. For the purpose of comparison, in both diagrams, results obtained by the conventional system in which the same organic EL devices are used and the circular polarizer is arranged are also shown and, further, the chromaticity coordinates of NTSC standard are also shown for reference in FIG. 4.

As shown in FIG. 3, in the present invention, the light intensity is enhanced by reusing the light which has been absorbed by the polarizer hitherto. Particularly, the intensity of the light in the wavelength range which is effective as blue light is increased. As shown in the CIE chromaticity diagram of FIG. 4, the color purity (excitation purity) is improved from the conventional value (54%) by 3% and the chromaticity coordinates more approaches the value of the blue light of NTSC standard. In the embodiment, luminance is improved by about 1.5 times as large as the conventional one.

Figure 5:
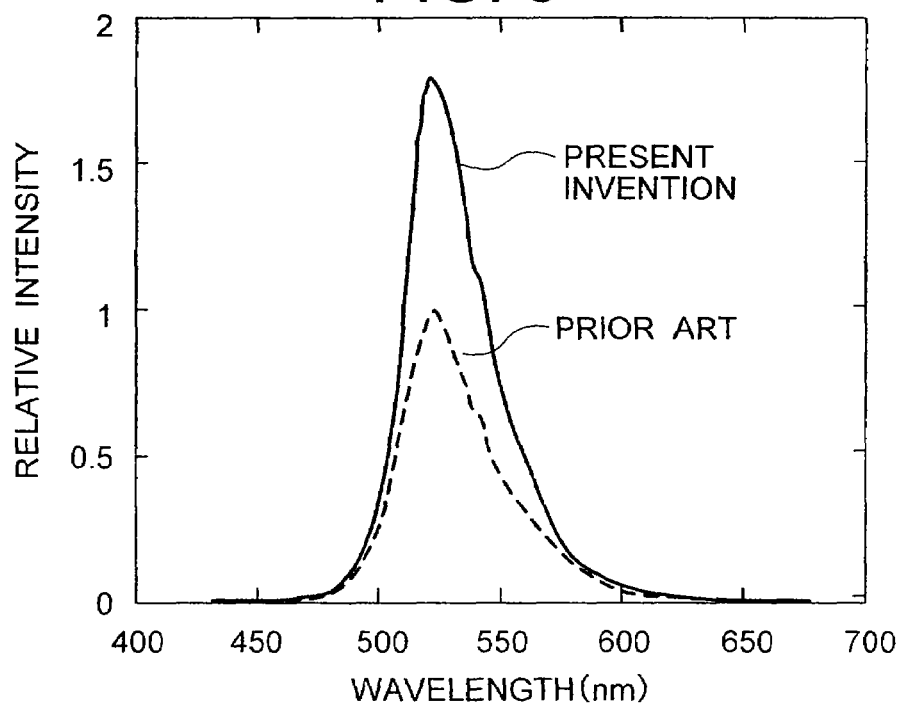
FIG. 5 is a graph showing an example of a relation between a relative intensity and a wavelength of light in the light-emitting devices of the embodiment of the invention.
Figure 6:
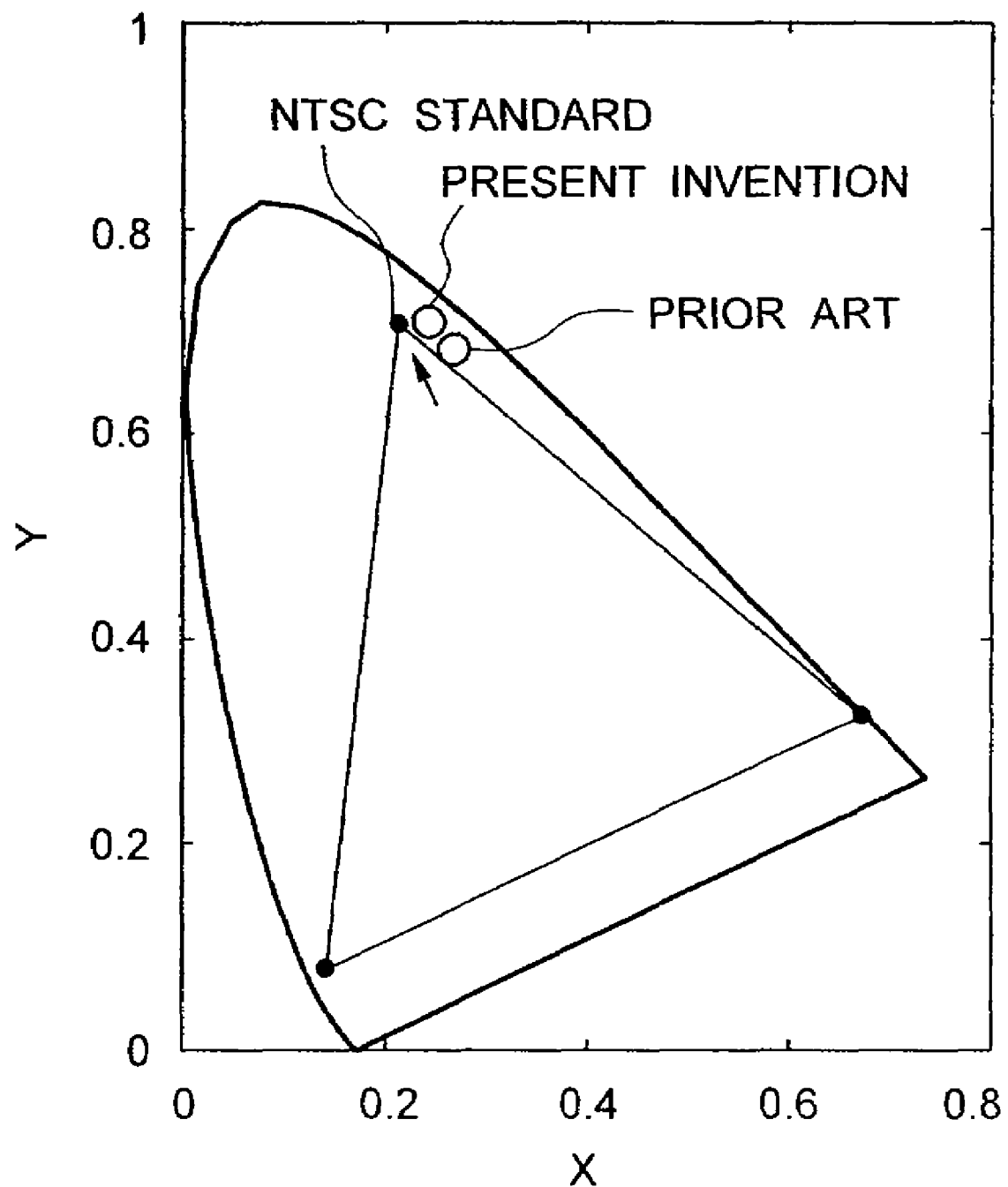
FIG. 6 is a CIE chromaticity diagram showing an example of CIE chromaticity coordinates in the light-emitting devices of the embodiment of the invention.

FIGS. 5 and 6 are similarly a graph showing a relation between relative intensity and a wavelength of the light emitted from the light-emitting devices according to the invention and a CIE chromaticity diagram showing CIE chromaticity coordinates, respectively. The diagram shows an effect which is obtained in the case where in the organic EL devices 150 of green light emission, the cholesteric liquid crystal layers having a wavelength range (G reflection) of the selective reflection in the wavelength of the green light shown in the example in FIG. 2 are used as polarization separators 500. For the purpose of comparison, in both diagrams, results obtained by the conventional system in which the same organic EL devices are used and the circular polarizer is arranged are also shown and, further, the chromaticity coordinates of NTSC standard are also shown for reference in FIG. 6.

As shown in FIG. 5, according to the invention, the light intensity is enhanced by reusing the light which has been absorbed by the polarizer hitherto. Particularly, the intensity of the light in the wavelength range which is effective as green light is enhanced. As shown in the CIE chromaticity diagram of FIG. 6, the color purity (excitation purity) is improved from the conventional value (94.5%) by 1.5% and the chromaticity coordinates approaches the value of the green light of NTSC standard. In the embodiment, the luminance is improved by about 1.6 times as large as the conventional one. Further, the contrast ratio under the bright environment (condition of illuminance of 180lx) is equal to 19 in case of the sole organic EL device 150, while it is improved to 36 in case of the light-emitting devices of the invention.

Also, with respect to red light, in the organic EL devices 150 of the red light emission, the cholesteric liquid crystal layers having a wavelength range of the selective reflection in the wavelength of the red light are used as polarization separators 500, so that effects such as improvement of the color purity and improvement of the luminance are obtained in a manner similar to the blue light and green light.

A relation between the light-emitting wavelength range of the organic EL devices 150 and the wavelength range of the selective reflection of the cholesteric liquid crystal layers constructing the polarization separators 500 is important in the light-emitting devices of the invention.

That is, the relation can be also changed in dependence on characteristics to which importance is attached. For example, in case of attaching importance to the color purity and the contrast ratio under the bright environment, it is desirable to set the wavelength range of the selective reflection of the cholesteric liquid crystal layers constructing the polarization separators 500 to be narrower than the wavelength range of the light emission of the organic EL devices 150. In this case, as the wavelength range of the selective reflection is narrower, the reflection of the incident ambient light is reduced more and the contrast ratio is improved more. However, since the improving effect of the luminance is reduced by an amount corresponding to such improvement, it is desirable to decide the selective reflection band in consideration of the use environment (presumed ambient brightness).

In case of attaching importance to the absolute luminance, it is effective to maximize an amount of reusable light by making the wavelength range of the light emission of the organic EL devices 150 almost coincide with the wavelength range of the selective reflection of the cholesteric liquid crystal layers constructing the polarization separators 500.

To satisfy both of the contrast ratio and the luminance, the wavelength range of the light emission of the organic EL devices is narrowed and the wavelength range of the light emission of the organic EL devices 150 and the wavelength range of the selective reflection of the cholesteric liquid crystal layers constructing the polarization separators 500 are made to almost coincide with each other. When the distribution of the light emission of the organic EL devices is calculated on the assumption that it is the Gaussian type in which the half value width is equal to 75 nm, the sufficient chromaticities (color purities) of R, G, and B are obtained (the journal of the institute of image information and television engineers, Vol. 54, No. 8, pp. 1116). Therefore, to satisfy both of the contrast ratio and the luminance, it is desirable that the half value width of the wavelength of the light emission of the organic EL devices and the half value width of the wavelength of the selective reflection of the cholesteric liquid crystal layers constructing the polarization separators 500 are set to be 75 nm or less.

If the cholesteric liquid crystal layers constructing the polarization separators 500 of R, G, and B use the same liquid crystal material, in principle, as the center wavelength of the selective reflection is longer, the wavelength range of the selective reflection is broader. That is, as compared with the cholesteric liquid crystal layers corresponding to the blue or green light, in principle, in case of the cholesteric liquid crystal layers corresponding to the red light, the wavelength range of the selective reflection is broader and the improving effect of the contrast ratio and the improving effect of the color purity decrease.

In this case, therefore, it is preferable that the center wavelength of the selective reflection of the cholesteric liquid crystal layers corresponding to the red light is set to a large wavelength side than the light-emitting peak wavelength or a longer wavelength side than the center wavelength of the organic EL devices, thereby making the wavelength range of the selective reflection in the visible wavelength range almost coincide with the wavelength range of the light emission of the organic EL devices.

According to the invention, in the light-emitting devices having the reflective elements on the back side of the emissive layer, the polarization separators, phase plate, and polarizer are arranged in front of them. It will be obviously understood that similar effects are obtained even if they have a construction which is not disclosed in the embodiment so long as it satisfies the above requirement.

EMBODIMENT 1 OF THE LIGHT-EMITTING DISPLAYS

Figure 7:
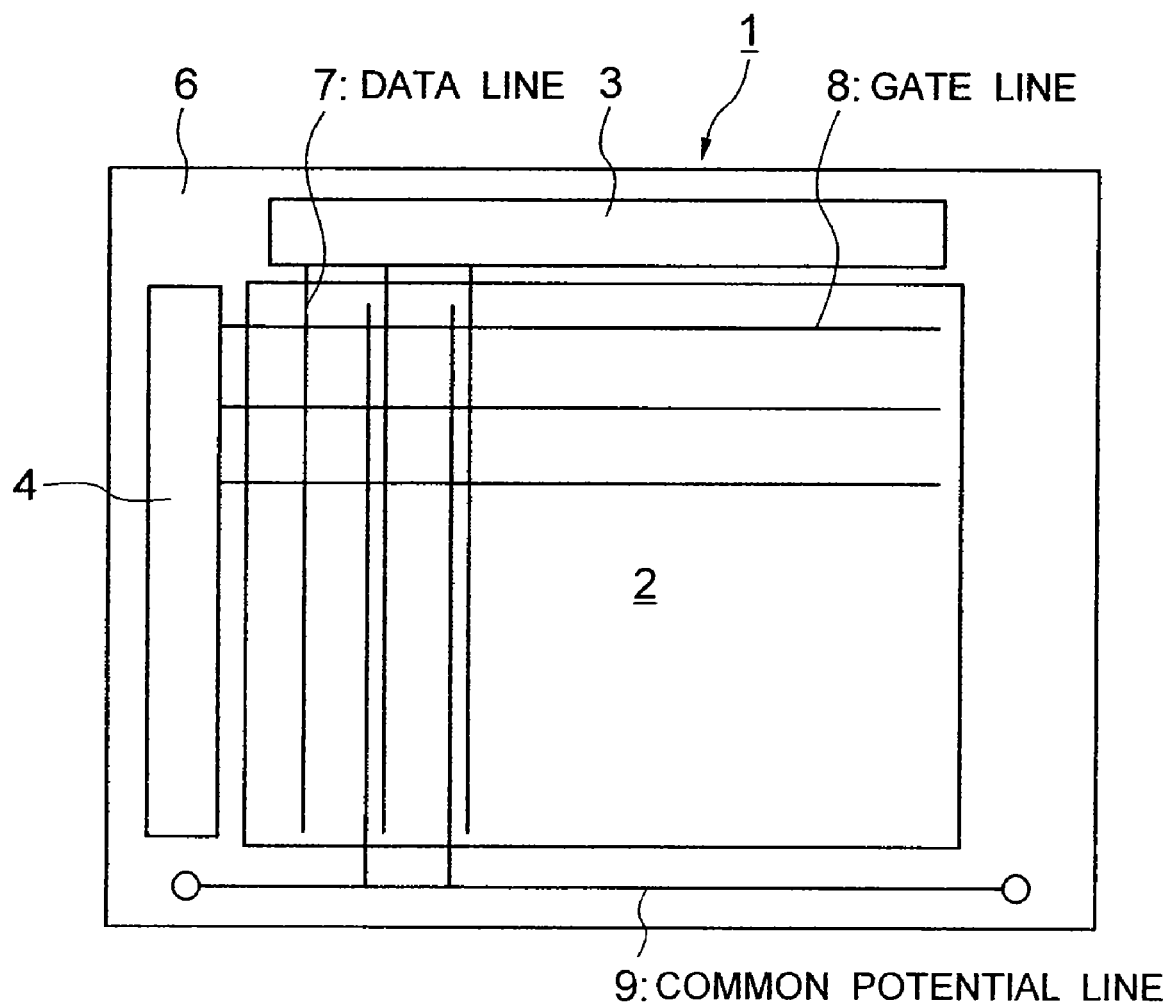
FIG. 7 is a block diagram schematically showing a whole layout as a light-emitting display of the embodiment of the invention.
Figure 8:
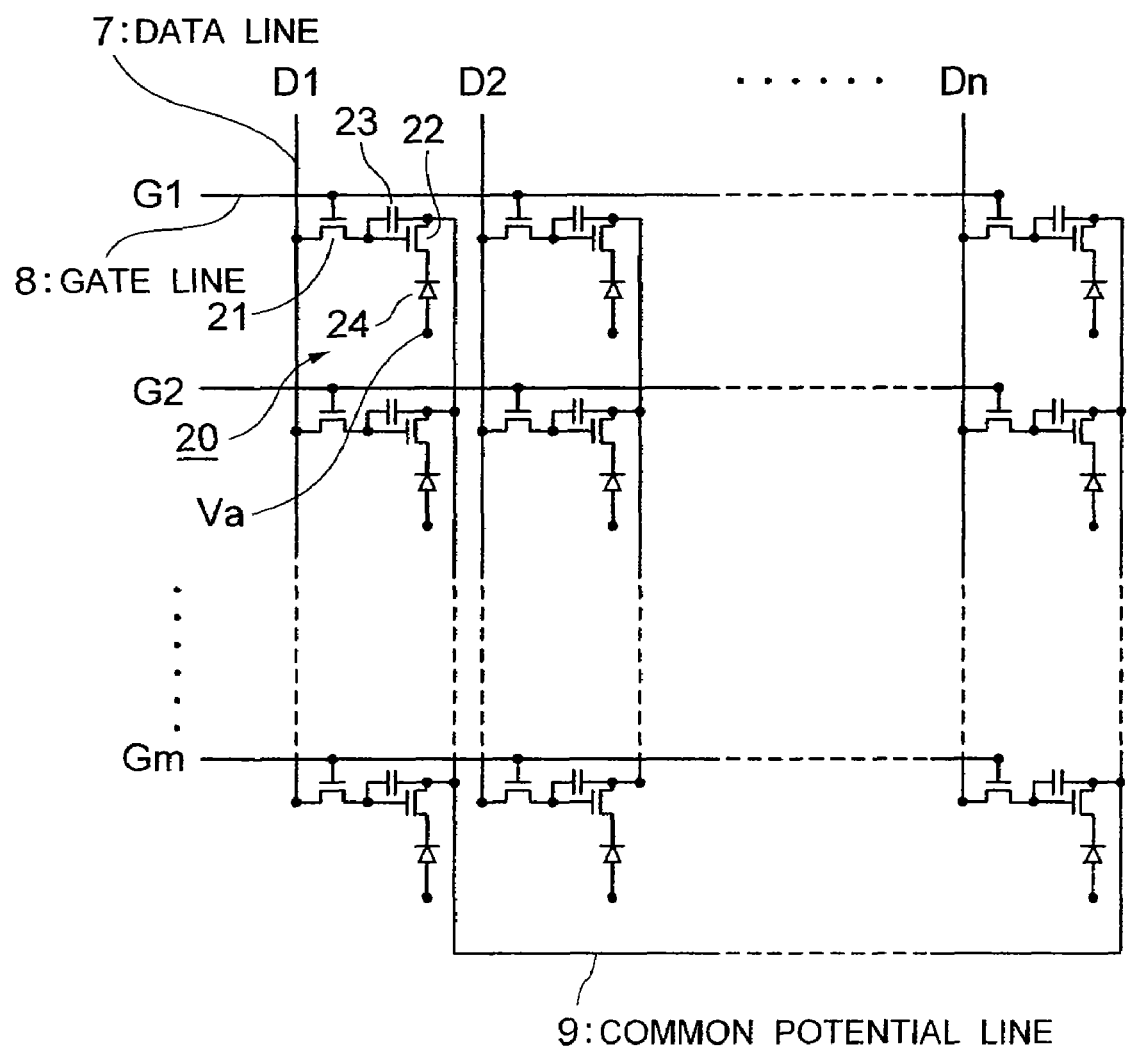
FIG. 8 is an equivalent circuit diagram of an active matrix constructing a display area of the light-emitting display of the embodiment of the invention.

Light-emitting displays in which a plurality of light-emitting elements of the invention are aligned and arranged, the light emitting operations of the plurality of light-emitting devices are controlled, and a display is performed will now be described. FIG. 7 is a block diagram schematically showing a whole layout of a light-emitting display 1 according to the invention. FIG. 8 is an equivalent circuit diagram of an active matrix constructed in a display area 2.

As shown in FIG. 7, in the display 1, the display area 2 is formed in almost a center portion of a substrate 6. A data driving circuit 3 for outputting an image signal to a data line 7 is formed on the upper side of the display unit 2 and a scan driving circuit 4 for outputting a scan signal to a gate line 8 is formed on the left side. Each of the driving circuits 3 and 4 is constructed by a shift register circuit a level shifting circuit, an analog switching circuit, and the like comprising a complementary type circuit by n-channel type and p-channel type TFTs (Thin Film Transistors).

In the display 1, in a manner similar to the active matrix of a liquid crystal display apparatus, a plurality of gate lines and a plurality of data lines which are extended in the direction which crosses an extending direction of the gate lines are provided on the first substrate 6. As shown in FIG. 8, pixels 20 are arranged in a matrix form at positions where those gate lines G1, G2, . . . , and Gm and data lines D1, D2, . . . , and Dn cross, respectively.

Each pixel is constructed by: the light-emitting device 24; a storage capacitor 23; a switching transistor 21 comprising an n-channel type TFT in which a gate electrode is connected to the gate line, one of a source electrode and a drain electrode is connected to the data line, and the other is connected to the storage capacitor 23; and a driver transistor 22 comprising an n-channel type TFT in which a gate electrode is connected to the storage capacitor 23, a source electrode is connected to a common potential line 9 extending in the same direction as that of the data line, and a drain electrode is connected to one electrode (cathode) of the organic EL device constructing the light-emitting device 24.

The other electrode (anode) of the organic EL device constructing the light-emitting device 24 is connected to a current supply line which is common to the pixels and held at a predetermined electric potential Va. The light-emitting devices for emitting the light of one of the R, G, and B colors among the light-emitting devices 24 are arranged in a matrix form in a predetermined order.

According to the above construction, when the switching transistor 21 is turned on by the scan signal, the image signal is written from the data line into the storage capacitor 23 through the switching transistor 21. Therefore, even if the switching transistor 21 is turned off, the gate electrode of the driving transistor 22 is held at the electric potential corresponding to the image signal by the storage capacitor 23.

The driving transistor 22 is continuously held in the driving state in a source grounding mode having excellent constant current performance. A current supplied from the current supply line flows in the organic EL device constructing the light-emitting device 24, so that the light-emitting device 24 is maintained in the light-emitting state. The light-emitting luminance at this time depends on data which is written in the storage capacitor 23. The stop of the light emission is realized by turning off the driving transistor 22.

Figure 9:
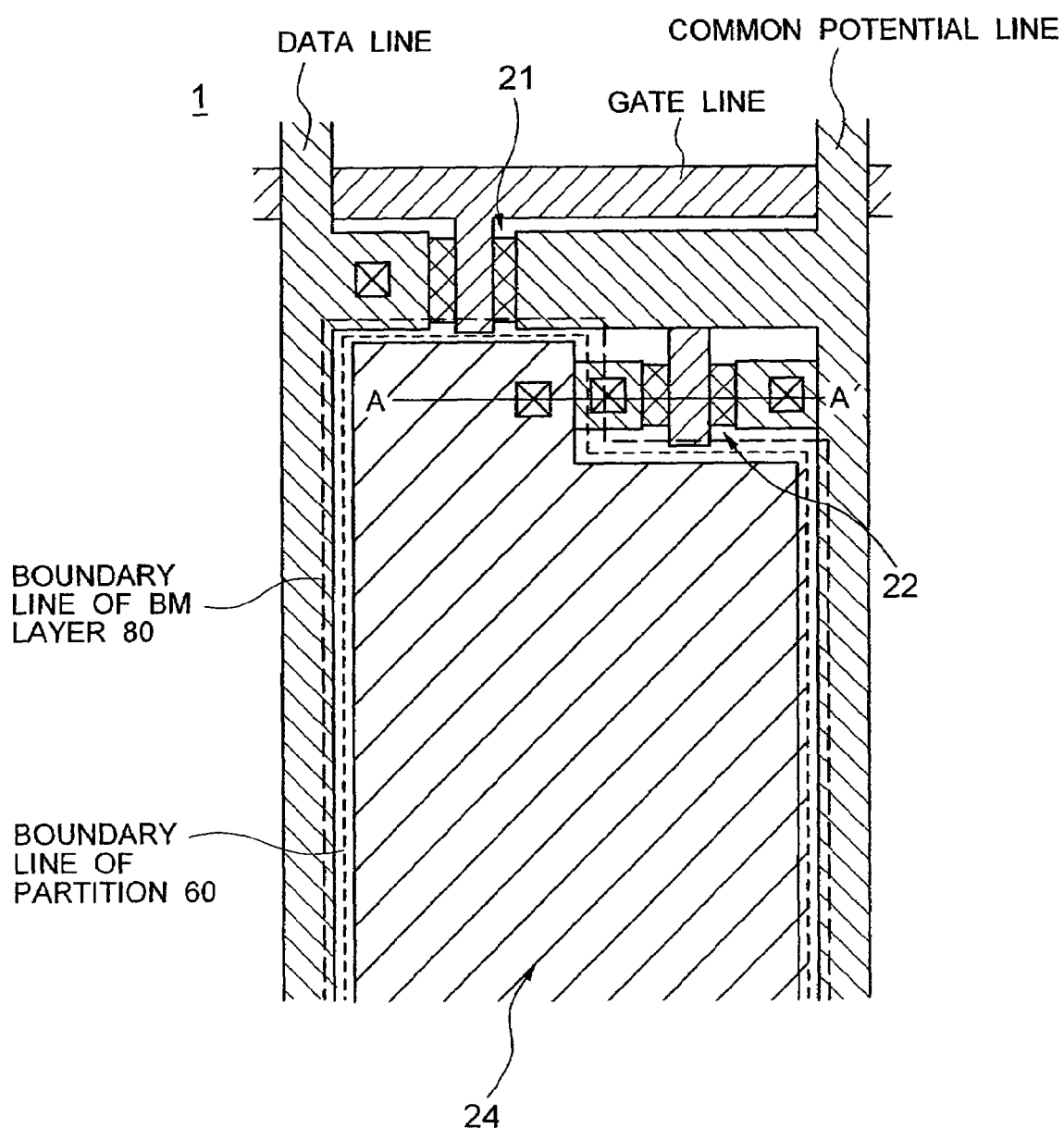
FIG. 9 is a plan view showing a part of a structure in a pixel portion of the light-emitting display of the embodiment of the invention.
Figure 10:
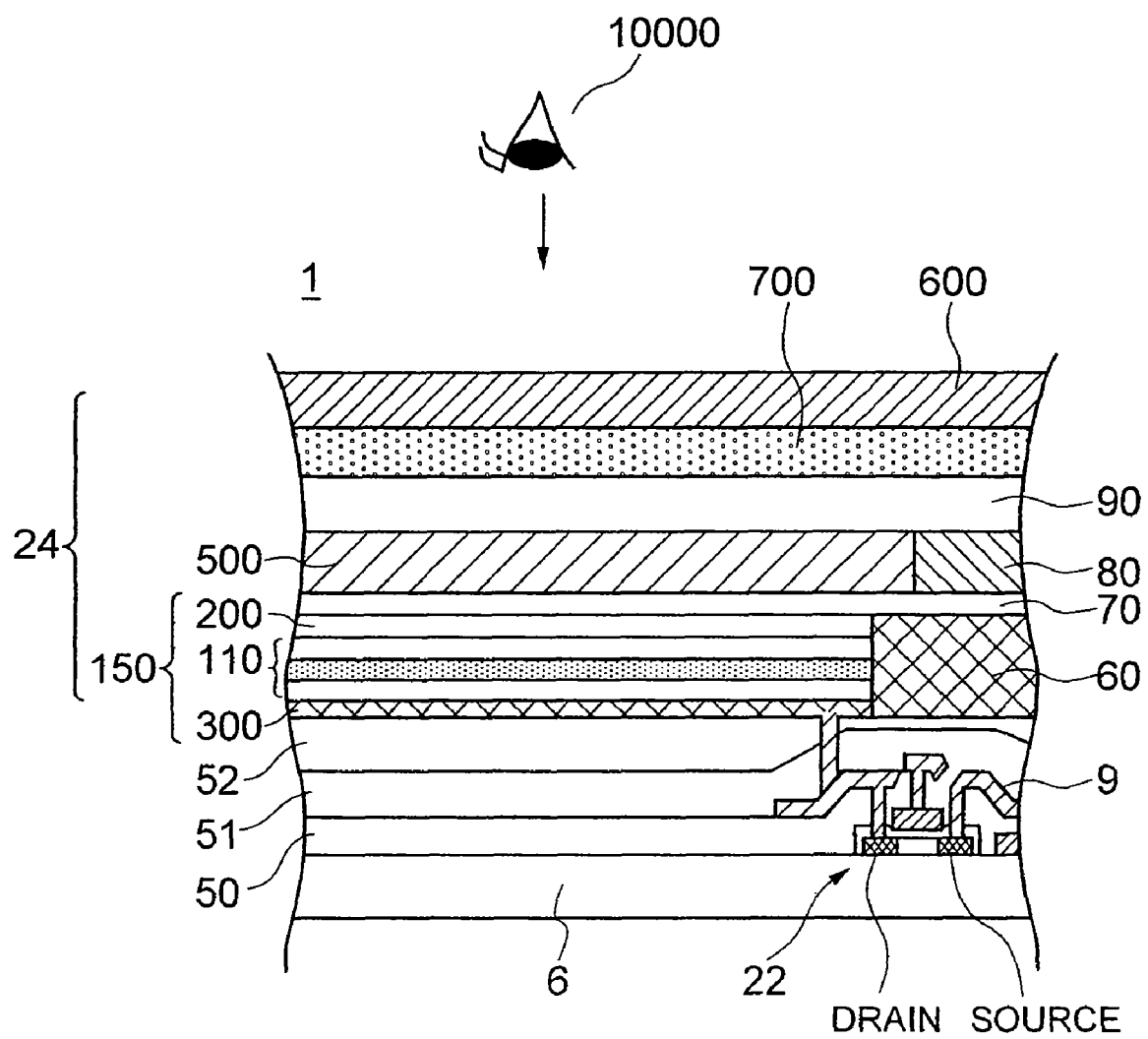
FIG. 10 is a cross sectional view taken along the line A-A' in FIG. 9.

A structure of the display 1 will now be described with reference to FIGS. 9 and 10. FIG. 9 shows a partial schematic diagram of a plan structure of the pixel portion in the display 1. FIG. 10 schematically shows a cross sectional structure taken along the line A-A' in FIG. 9. A silicon layer in an island shape to form the switching transistor 21 and driving transistor 22 is formed on the flat first substrate 6 such as a glass plate and a gate insulation layer is formed on the surface of the silicon layer. The gate electrode, gate line are formed on the gate insulation layer. After that, source-drain regions are formed. Further, a first interlayer insulation layer 50 is formed and the data line, a common potential line, and electrode for storage capacitor are formed through contact holes.

Further, a second interlayer insulation layer 51 and a planarization layer 52 made of an insulating material are formed. Electrodes having a light reflecting function and serving as a cathode 300 of the light-emitting device 24 are pattern-formed in a island shape onto the layer 52. The cathode 300 is connected to the drain of the driving transistor 22 through the contact holes of the second interlayer insulation layer 51 and planarization layer 52. A partition 60 made of a photoresist resin material in which a black dye having light absorbing property has been dispersed is formed on the planarization layer 52 so as to surround the region where the cathode 300 has been formed. The partition 60 is formed by a photolithographic process.

The organic layer 110 having an emissive layer for emitting light of one of the R, G, and B colors is pattern-formed on the cathode 300 in accordance with a predetermined layout. It is possible to select the organic layer 110 from the foregoing structures and materials. In the case where the organic layer 110 is a small molecular material, it is sufficient to perform the patterning of the organic layer 110 by using a well-known patterning technique of a vacuum evaporation deposition organic layer by a shadow mask (for example, disclosed in S. Miyaguchi, et al., "Organic LED Fullcolor Passive-Matrix Display", Journal of the SID, 7, 3, pp. 221-226 (1999)). In this manufacturing step, the partition 60 can be used as stopper elements of the shadow mask.

In the case where the organic layer 110 is made of a polymeric material, it is sufficient to use a well-known ink-jet patterning technique (for example, disclosed in T. Shimoda, et al., "Multicolor Pixel Patterning of Light-Emitting Polymers by Ink-Jet Printing", SID 99, Digest, P. 376, (1999)). In this manufacturing step, the partition 60 functions as a bank for separating the pixel region.

The anode (transparent electrodes 200) serving as counter electrodes is formed on the whole surface above the organic layer 110. The transparent electrodes 200 are connected to a current supply line (not shown). A planarization layer 70 made of a transparent insulating material is formed on the transparent electrodes 200. The planarization layer 70 is used for protecting the transparent electrodes 200 and allowing the members which are arranged thereon to be easily stacked.

As a planarization layer 70, it is sufficient to use an organic material such as transparent acrylic resin, benzo cyclobutene resin, polyimide resin, or the like. In case of those organic materials, by forming a film by a spin coating method or the like, its surface can be relatively easily flattened. A second substrate 90 made of a transparent flat substrate which is optically isotropic is stacked over the planarization layer 70.

A black matrix layer (BM layer) 80 and the polarization separators 500 are formed on one side of the second substrate 90, and the phase plate 700 and polarizer 600 are laminated and arranged on the other side. The second substrate 90 is arranged in a manner such that the surface where the polarization separators 500 have been formed faces the surface of the first substrate 6 where the organic layer 110 has been formed. As for the polarization separators 500 formed on the second substrate 90, the cholesteric liquid crystal layers having the wavelength range of the selective reflection corresponding to the color of the light emitted from the emissive layer of the organic layer 110 have been pattern-formed. The relation between the wavelength range of the selective reflection of the cholesteric liquid crystal layers and the wavelength range of the light emission in the organic layer 110 is as described above.

The first substrate 6 and second substrate 90 are overlaid so that the position of the organic layer 110 which was pattern-formed almost coincides with the position of the cholesteric liquid crystal layers which were pattern-formed, the whole surfaces are closely adhered with a transparent adhesive agent or a periphery of the display area is sealed by a frame-shaped sealing material, and nitrogen is sealed therein, thereby hermetically adhering them.

Figure 11:
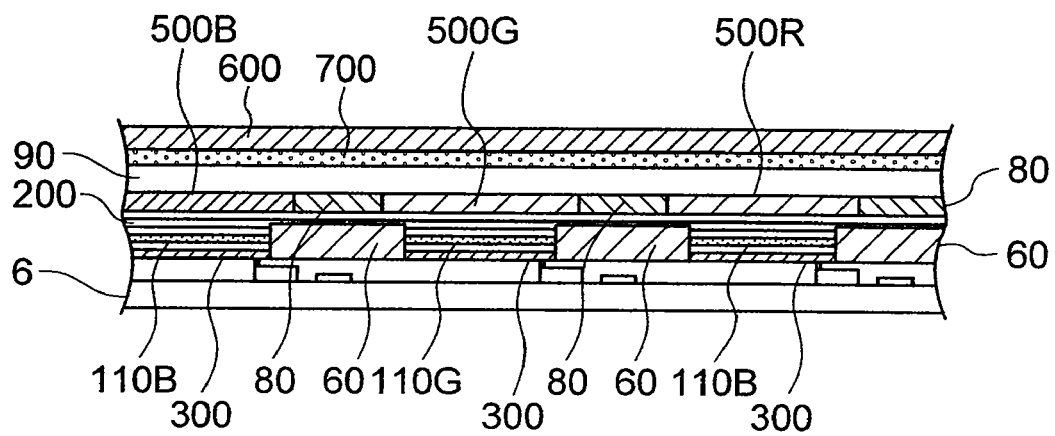
FIG. 11 is a schematic constructional showing a partial cross section of the light-emitting display of the embodiment of the invention.
Figure 12:
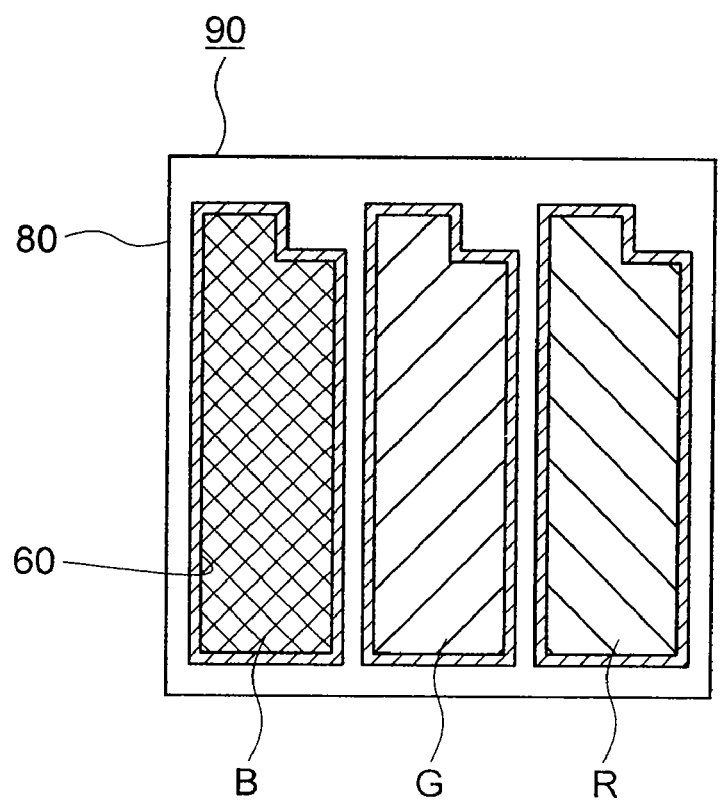
FIG. 12 is a partial plan view of the light-emitting display of the embodiment of the invention.
Figure 13A:
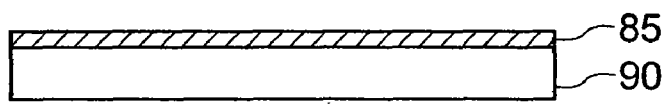
FIGS. 13A, 13B, 13C, and 13D are cross sectional views for explaining a forming step of a black matrix layer of the embodiment of the invention.
Figure 13B:
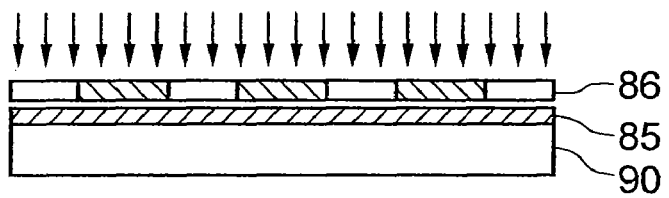
Figure 13C:
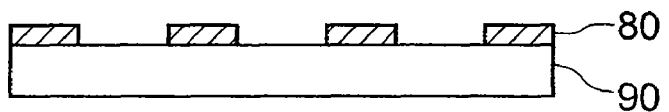
Figure 13D:
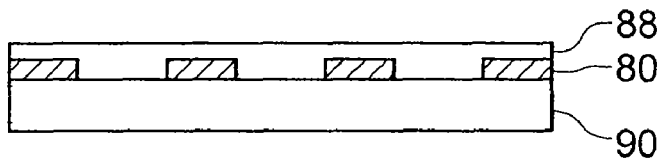

FIG. 11 is a schematic constructional diagram showing a partial cross section of the display 1. FIG. 12 is a partial front view of the display 1. As shown in FIG. 11, cholesteric liquid crystal layers 500R of the R reflection having a wavelength range of the selective reflection corresponding to red is formed on an organic layer 110R of the red (R) light emission. Cholesteric liquid crystal layers 500G of the G reflection having a wavelength range of the selective reflection corresponding to green is formed on an organic layer 110G of the green (G) light emission. Cholesteric liquid crystal layers 500B of the B reflection having a wavelength range of the selective reflection corresponding to blue is formed on an organic layer 110B of the blue (B) light emission.

As shown in FIG. 12, the BM layer 80 formed on the second substrate 90 is formed smaller than the partition 60 formed on the first substrate 6. This is because by forming the BM layer 80 so as to be smaller than the partition, it is intended to avoid a situation such that the light emitted from the organic layer 110 is shielded by the BM layer 80 and the display becomes dark, and it is also intended to assure a margin upon matching.

A method of forming the BM layer 80 and the polarization separators 500 of the second substrate 90 will now be described.

As a BM layer 80, in a manner similar to the material used for the liquid crystal display, it is possible to use metal chromium, chromium oxide and a photoresist resin in which a light shielding pigment such as carbon black, or the like has been dispersed. In the light-emitting devices of the invention, particularly, since the improvement of a picture quality by reducing the reflection of the incident ambient light (maintaining of a high contrast ratio under the bright environment) is required, low reflectance is required for the BM layer. From this requirement, it is desirable that a photoresist resin in which the light shielding pigment in which reflectance can be minimized has been dispersed is used as a BM layer.

However, according to the light-emitting devices of the invention, since the phase plate 700 and polarizer 600 are arranged on the outer side of the BM layer 80, that is, on the viewer side and they function as a circular polarizer, even in case of metal chromium having high reflectance, the incident ambient light reflection by metal chromium is suppressed. Therefore, it can be used.

An example of a step of forming the BM layer 80 onto the second substrate 90 will now be described. FIGS. 13A, 13B, 13C, and 13D are explanatory diagrams of a forming step of the BM layer 80 by the photoresist resin in which the light shielding pigment has been dispersed.

[FIG. 13A]

First, a negative photoresist resin 85 in which carbon black has been dispersed is coated onto the transparent flat second substrate 90 which is optically isotropic by a spin coater, a roll coater, or the like. At this time, a thin layer for improving adhesiveness can be also preliminarily formed on the second substrate 90.

As a second substrate 90, besides the glass plate, it is possible to use a polymer film such as polycarbonate film, triacetylcellulose film, or the like formed as a film by a casting method, a plastic sheet or plastic film which is optically isotropic such as alicyclic acryl resin (trade name: OPTOREZ®, made by Hitachi Chemical Co., Ltd.) or the like formed by an injection molding, or the like.

[FIG. 13B]

Subsequently, the coated layer is temporarily hardened by using a hot plate or the like and exposed by using a mask 86 having a predetermined pattern by an exposure system having a wavelength matched with a sensitivity of the negative photoresist resin 85.

[FIG. 13C]

After that, by developing it, the exposed portion remains as a BM layer 80. The portion shielded against the light by the mask is melted and the substrate surface is exposed.

[FIG. 13D]

Subsequently, cleaning and drying are performed, a transparent resin such as acrylic resin, polyimide resin, or the like is coated, and a planarization layer 88 for flattening the surface is constructed.

An example of a method of forming the polarization separators 500 comprising the cholesteric liquid crystal layers onto the second substrate 90 formed with the BM layer 80 will now be described.

It is sufficient to use a well-known technique as a method of forming the cholesteric liquid crystal layers having the wavelength ranges of the selective reflection corresponding to R, G, and B in a plane. For example, there is a method of printing different liquid crystal materials or a method of coating a liquid crystal polymer onto the whole surface and, subsequently, pattern-forming layers of the R reflection, G reflection, and B reflection by some method.

As a method of coating the liquid crystal polymer onto the whole surface and, subsequently, pattern-forming the R, G, and B layers by some method, there is a method of fixing a structure by photopolymerization while changing a temperature by using a thermochromic property of the wavelength of the selective reflection (disclosed in, for example, R. Maurer, et al, SID94, Digest, pp. 399-402, (1994)), a method of controlling the wavelength of the selective reflection by light irradiation (for example, JP-A-2000-147236), or the like.

As a method of pattern-forming the cholesteric liquid crystal layers having the wavelength ranges of the selective reflection corresponding to R, G, and B in a plane, an arbitrary method can be used so long as the regions where the desired selective reflection is obtained are pattern-formed.

Figure 14A:
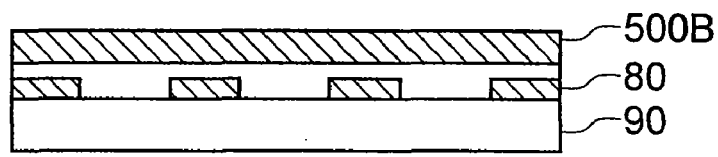
FIGS. 14A, 14B, and 14C are cross sectional views for explaining a pattern forming step of polarization separators of the embodiment of the invention.
Figure 14A:
Figure 14B:
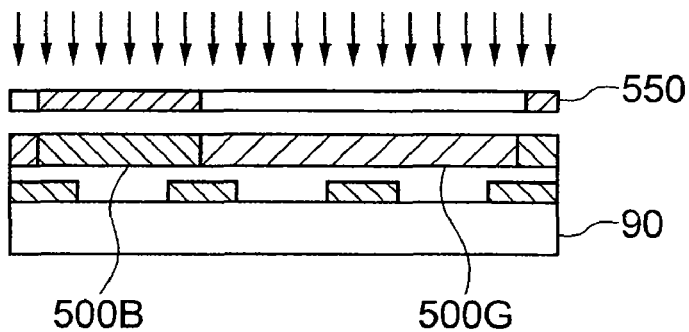
Figure 14B:
Figure 14C:
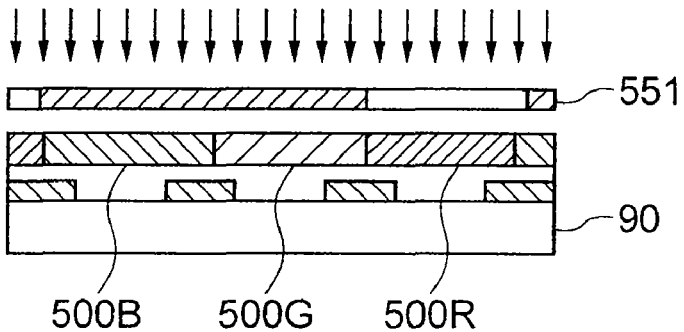

FIGS. 14A, 14B, and 14C are diagrams for explaining an example of a method of forming the polarization separators 500 constructed by the cholesteric liquid crystal layers which were pattern-formed on the second substrate 90 formed with the BM layer 80.

A method of controlling the wavelength of the selective reflection by the light irradiation will now be described. This method is a method of controlling the wavelength of the selective reflection by cutting a chiral active group by irradiating ultraviolet rays in a system in which a photo acid generator has been added to a side chain liquid crystal polymer in which a monomer unit to which the chiral active group has been coupled through a Schiff base is used as one component. That is, in the liquid crystal polymer (copolymer), a helical pitch of the cholesteric liquid crystal changes on the basis of a percentage content of a monomer unit containing the chiral active group and the wavelength of the selective reflection is determined by this pitch. Therefore, it is a method of controlling the wavelength of the selective reflection by controlling the percentage content. As the percentage content of the monomer unit containing the chiral active group is higher, the pitch is smaller and the wavelength range of the selective reflection is shifted to the short wavelength side.

Therefore, the liquid crystal polymer showing the wavelength of the selective reflection which is equal to or shorter than that of the blue light is used as a base, ultraviolet rays are first properly irradiated onto the regions indicative of the selective reflection of green and red through a photomask, and a thermal alignment process is performed. After that, the irradiation of the ultraviolet rays merely to shift the wavelength of the selective reflection from green to red is newly performed to the region which should indicate the selective reflection of red and the thermal alignment process is executed, thereby forming the desired cholesteric liquid crystal layers which were pattern-formed to the R reflection, G reflection, and B reflection.

An example of the steps will now be described with reference to FIGS. 14A, 14B, and 14C.

[FIG. 14A]

First, a polyvinyl alcohol layer is provided as an alignment layer (not shown) onto the surface of the second substrate 90 on which the BM layer 80 has been formed. A liquid crystal polymer is coated onto the treatment surface obtained by rubbing the polyvinyl alcohol layer with a rayon cloth. As a liquid crystal polymer, it is possible to use a side chain type cholesteric liquid crystal polymer comprising a copolymer of a monomer shown in the following expression (5) as a nematic liquid crystal monomer

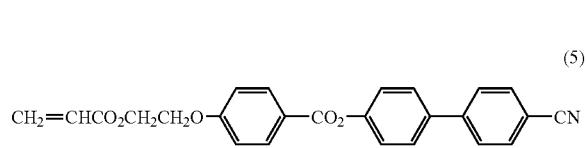

(5)

and a monomer shown in the following expression (6) as a monomer containing a chiral active group.

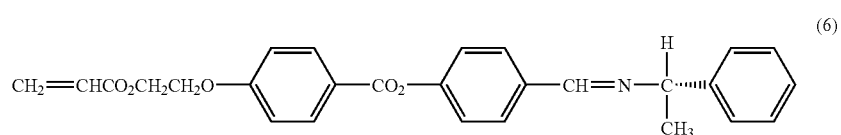

(6)

A material obtained by adding 2,4-bis(trichloromethyl)-6-(3'-chloro-4'-methoxy-β-styryl) triazine into a cyclohexanone solution in which the above liquid crystal polymer has been solved is coated onto the substrate 90, dried, and subjected to the thermal alignment process at 160° C. for 5 minutes. After that, it is left and cooled at a room temperature, thereby obtaining the non-fluid cholesteric liquid crystal layer 500B having a center wavelength of 440 nm in the selective reflection.

[FIG. 14B]

Subsequently, ultraviolet rays are irradiated onto the regions which should indicate the selective reflection of green and red of the non-fluid liquid crystal layer 500B through a photomask 550 having two regions of a transmittance 100% and a transmittance 0%. The layer is subjected again to the thermal alignment process at 160° C. for 5 minutes. After that, it is left and cooled at a room temperature, thereby obtaining the non-fluid pattern-formed cholesteric liquid crystal layer 500G having a center wavelength of 540 nm in the selective reflection.

[FIG. 14C]

Further, ultraviolet rays are irradiated onto the region which should indicate the selective reflection of red through a photomask 551. After that, the layer is subjected again to the thermal alignment process at 160° C. for 5 minutes and it is left and cooled at a room temperature, thereby obtaining the non-fluid pattern-formed cholesteric liquid crystal layer 500R having a center wavelength of 630 nm in the selective reflection.

By the above processes, the cholesteric liquid crystal layers which were pattern-formed to the R reflection, G reflection, and B reflection are formed. Transparent protection layers can be also provided on the surface of the cholesteric liquid crystal layers as necessary.

The second substrate 90 on which the BM layer 80 and polarization separators 500 have been formed is arranged in a manner such that the surface on which the polarization separators 500 have been formed faces the surface of the first substrate 6 on which the organic layer 110 has been formed. In this instance, the first substrate 6 and second substrate 90 are positioned so that the position of the pattern-formed organic layer 110 is almost matched with the position of the pattern-formed cholesteric liquid crystal layers and, thereafter, overlaid, and the whole surfaces of them are hermetically adhered with a transparent adhesive agent, or the regions other than the display area are adhered with a frame-shaped sealing member and those substrates are sealed in a state where a space is sealed with nitrogen.

The phase plate 700 and polarizer 600 are laminated and arranged on the side of the second substrate 90 opposite to the side on which the polarization separators 500 have been formed. The phase plate 700 and polarizer 600 are as described above and optically matched with an acrylic transparent adhesive agent, respectively.

In place of the second substrate, the polarization separators can be also directly formed on the phase plate. In this case, it is desirable to use a material such that the characteristics such as a phase difference and the like are not changed by heat or the like in the step of pattern-forming the cholesteric liquid crystal layers.

Figure 15A:
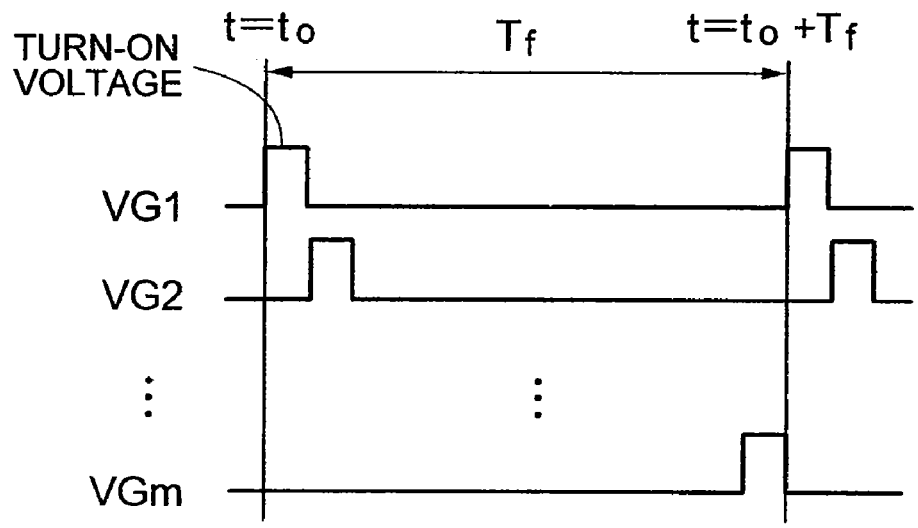
FIGS. 15A and 15B are time charts for explaining the display operation of the light-emitting display of the embodiment of the invention.
Figure 15B:
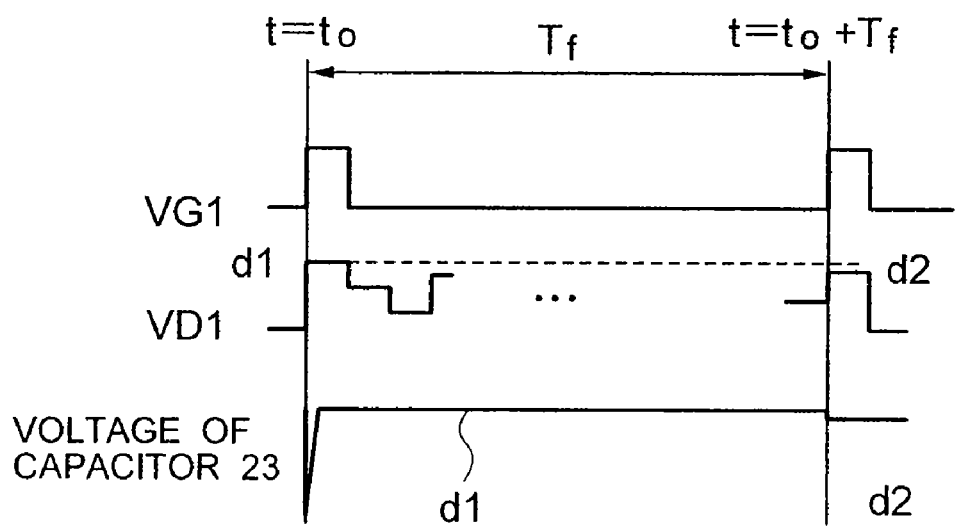

The display operation of the display 1 will now be described with reference to FIGS. 8, 15A, and 15B. FIG. 15A is a time chart of voltages VG1, VG2, . . . , and VGm which are sequentially applied to the gate lines G1, G2, . . . , and Gm. FIG. 15B is a diagram showing an example of the gate voltage VG1 and a data voltage VD1 which are located on the first row and the first column and a voltage state of the storage capacitor 23.

As shown in FIG. 15A, the voltages VG1, VG2, . . . , and VGm to turn on the switching transistor 21 are sequentially applied to the gate lines G1, G2, . . . , and Gm. When the voltage VG1 to turn on the switching transistor 21 is applied to the gate line G1 at time t=t0, the scan in the vertical direction is finished once in a 1-frame period Tf and timing when the turn-on voltage is applied again to the gate line G1 is time t=t0+Tf. According to this driving scheme, the time when the turn-on voltage is applied to one gate line is equal to Tf/m or shorter. Generally, about 1/60 second is used as a value of Tf.

When the turn-on voltage is applied to a certain gate line, all of the switching transistors connected to the gate line are ON. Synchronously with them, data voltages according to the image signal are applied to the data lines D1, D2, . . . , and Dn. This system is what is called a line sequential scan system and generally used in the active matrix liquid crystal display.

Subsequently, attention is paid to the pixel 20 locating at the first row and the first column, and the gate voltage VG1, the data voltage VD1, and the voltage state of the storage capacitor 23 will be described with reference to FIG. 15B. At timing t=t0, a value of the data voltage VD1 synchronized with VG1 is assumed to be d1 and a value of the data voltage in the next frame t=t0+Tf is assumed to be d2. In this case, while the turn-on voltage is applied to the gate line G1, those data voltages are stored into the storage capacitor 23 and held to almost those values for the 1-frame period. Those voltage values specify the gate voltage of the driving transistor 22. Since a value of the current flowing in the transistor is controlled by it, a predetermined current which is determined by those voltages, a (predetermined) voltage which is applied by a common potential line, and the (predetermined) voltage Va applied to the transparent electrodes of the light-emitting devices 24 flows in the light-emitting devices 24, thereby causing a predetermined light emission.

That is, a light-emission amount of the pixel can be controlled by applying the voltage corresponding to the image information to the data line synchronously with the timing when the turn-on voltage is applied to the gate line corresponding to the pixel whose light-emission amount should be controlled. Therefore, by controlling the light-emission amount of a plurality of pixels constructing the display area 2 in accordance with the image information, a desired image can be displayed. Since a response time which is required until the start of the light emission after the voltage was applied between the cathode and anode of the light-emitting device 24 is generally equal to or less than 1 μsec, an image display which can also follow an image of a fast motion can be realized.

Generally, according to the organic EL devices, when the current flowing thereto is increased, its light-emission amount increases and the bright display can be obtained. However, an electric power consumption increases by an amount corresponding to it and a lifetime (for example, time which is required until the light-emission amount decreases to the half of the initial value) of the device becomes short.

As mentioned above, according to the light-emitting devices 24 of the light-emitting displays 1 of the invention, the light which has been absorbed by the polarizer and has become the loss hitherto can be also used as display light due to the operation of the polarization separators, so that the luminance is improved by 1.6 times or more. Therefore, even in case of the same electric power consumption, there is an effect such that the light-emitting displays of higher luminance and brighter display can be realized, or in case of the same luminance (brightness), since the current flowing in the light-emitting devices can be reduced, there is an effect such that the light-emitting displays in which an electric power consumption is small and the lifetime is further long can be realized.

Further, the light-emitting display 1 has an effect such that the color purity of the color light emitted to the viewer side is improved more than that of the light-emission color itself from the emissive layer owing to the operation of the polarization separators of the light-emitting devices 24 mentioned above. There is, consequently, an effect such that the display color gamut of the light-emitting display is widened.

In the light-emitting display 1, the partition in which the pigment having light absorbing property has been dispersed is provided around the light-emitting devices of each pixel. Since the light emitted from the emissive layer in the direction that is parallel with the substrate surface is shut out by this partition, a display without a blooming of the pixel is obtained. Further, since the partition prevents a situation that the light emitted from the emissive layer and reflected by the polarization separators leaks to another pixel, there is an effect such that the color mixture and the blooming are prevented. That is, since each pixel is optically separated by the partition, a high quality display without the color mixture and blooming is obtained.

By forming the partition to a region wider than the BM layer provided on the polarization separators side, there are obtained effects such as improvement of the productivity owing to the assurance of the position matching margin of the pattern-formed emissive layer and the pattern-formed polarization separators and improvement of the contrast ratio under the bright environment due to the reduction of the external light reflection.

Further, the partition can be allowed to function as a spacer at the time of overlaying the first substrate on which the organic EL device has been formed and the second substrate on which the polarization separators have been formed. In this case, there is an effect such that the occurrence of defects due to the contact between the organic EL device and the polarization separators is prevented.

In the embodiment, the polarization separators and the organic EL device are formed onto the different substrates and overlaid lastly. This is because, in case of forming both of them onto the same substrate, for example, in case of patterning the polarization separators onto the substrate on which the organic layer has already been formed, inconveniences such that the temperature of the substrate rises in the patterning step of the polarization separators the organic layer deteriorates, and the like occur.

That is, by forming the polarization separators and the organic EL device onto the different substrates, a degree of freedom in each step is widened and they are not deteriorated, so that the devices having higher performance can be constructed. The invention does not reject a structure such that the polarization separators and the organic EL device are formed onto the same substrate if, for example, an organic material having high heat resistance is developed in future.

According to the light-emitting displays of the invention, if the distance between the polarization separators and the cathode is long, the light reflected by the polarization separators leaks to the cathode of the pixel different from the inherent pixel and the resolution deteriorates. The light emitted from the emissive layer and the light reflected by the polarization separators are absorbed by the partition or the like, so that an inconvenience such that the light directing toward the viewer is decreased or the like occurs. To prevent it, it is desirable that the distance between the polarization separators and the cathode is as short as possible from a viewpoint of improvement of the picture quality and the using efficiency of the light emitted from the emissive layer.

When the substrate exists between the organic EL device and the polarization separators, if the substrate is made of glass, a thickness of substrate itself is equal to hundreds of μm and a thickness of substrate made of a plastic film is equal to or larger than tens of μm, so that the distance between the polarization separators and the cathode becomes long.

On the other hand, in the present light-emitting displays, the extraction of the light from the organic EL device is performed from the direction opposite to that of the first substrate on which the organic EL device has been formed and, further, the polarization separators are overlaid through a transparent thin planarization layer or insulation layer. With such a structure, the distance between the polarization separators and the cathode can be reduced to 10 μm or less. Therefore, the light which is absorbed by the partition or the like and becomes the loss decreases, the using efficiency of the emission light is improved, and the brighter display is obtained. Further, in this case, a situation such that the light reflected by the polarization separators leaks to the different pixel and the deterioration of the resolution, the color mixture, or the like is not caused. There is, consequently, an effect such that the high quality display is obtained.

As an pixel arrangement of the display area of the light-emitting display, any one of a stripe arrangement, a mosaic arrangement, a delta arrangement, and the like can be used. It is sufficient to select a proper pixel arrangement in accordance with the specifications of the light-emitting display. Although the embodiment has been described with respect to the active matrix driving type displays, the invention is not limited to it. That is, the invention can be also applied to a passive matrix driving type display such that a TFT is not provided but the anode and cathode of the light-emitting devices of the invention are directly connected to the vertical scanning lines and horizontal scanning lines and driven.

EMBODIMENT 2 OF THE LIGHT-EMITTING DISPLAYS

Figure 16:
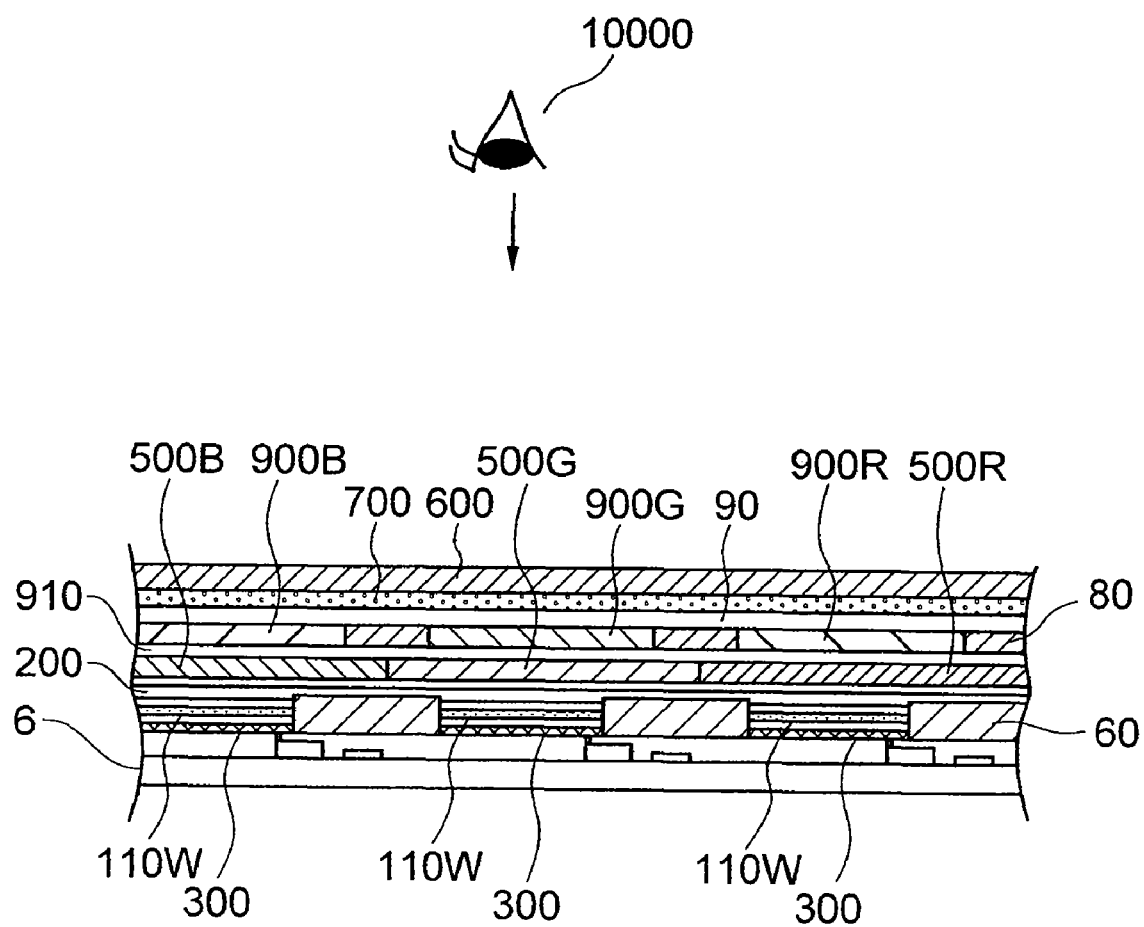
FIG. 16 is a cross sectional view showing a part of a schematic construction in the light-emitting display of the embodiment of the invention.
Figure 17A:
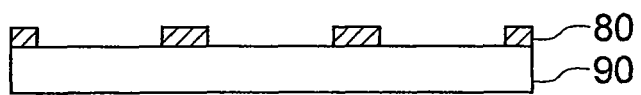
FIGS. 17A, 17B, 17C, 17D, 17E, and 17F are cross sectional views for explaining forming steps of color filters and polarization separators according to another embodiment of the invention.
Figure 17B:
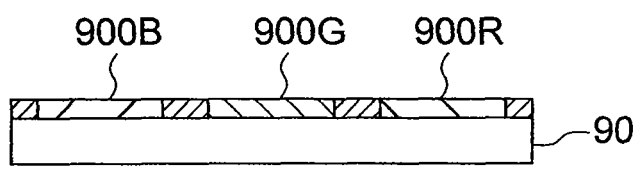
Figure 17C:
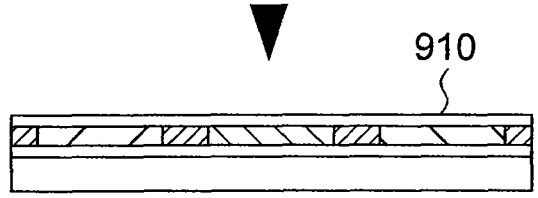
Figure 17D:
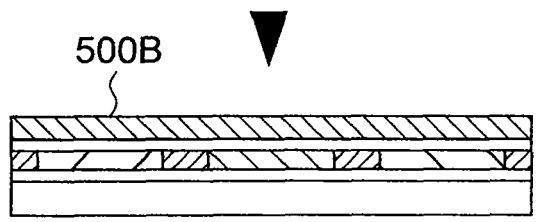
Figure 17E:
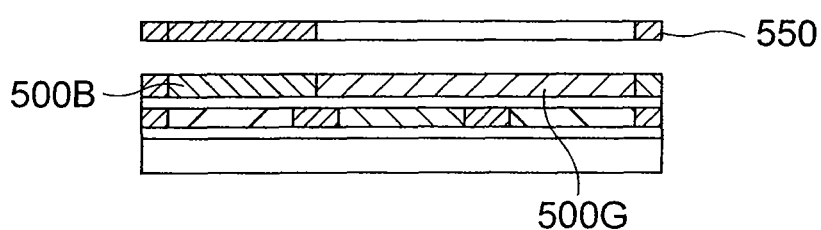
Figure 17F:
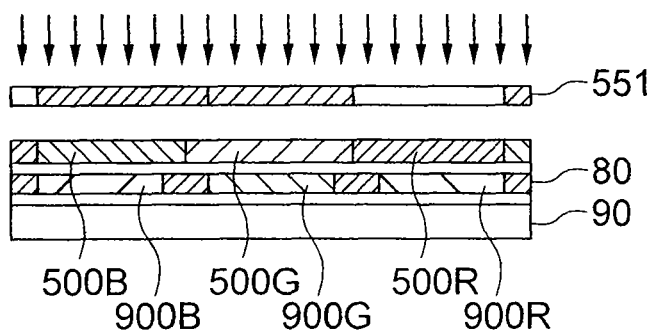

Another embodiment of the light-emitting displays in the invention will now be described. FIG. 16 is a partial cross sectional view showing an outline of the light-emitting display of the invention. Since a fundamental construction of the display is substantially the same as that of the foregoing embodiment except that the light-emission color of organic layers 110W is white and the display has color filters, the same and corresponding portions are designated by the same reference numerals and their detailed descriptions are omitted.

As shown in FIG. 16, according to the present display, in the embodiment described with reference to FIG. 11, all of the organic layers which were pattern-formed to R, G, and B are replaced with the organic layers 110W of white light emission, and color filters 900R, 900G, and 900B for transmitting the lights corresponding to R, G, and B are pattern-formed between the second substrate 90 and the polarization separators 500, respectively.

As organic layers which realize the white light emission, there are a construction such that a plurality of emissive layers of different light-emission colors are deposited and a construction such that dyes of different light-emission colors are doped into one emissive layer.

As a former construction, for example, there is a construction such that TPD and Alq3 is partially doped by Nile Red and 1,2,4-triazole derivatives (TAZ) is combined. As a latter construction, there is a construction such that three kinds of dyes, for example, 1,1,4,4-tetraphenyl-1,3-butadiene (TPB), coumarin 6, and DCM1 are doped into PVK. Either way, as organic layers of the white light emission, it is desirable to use the construction such that the white light emission in which light-emitting efficiency is high and a long lifetime is obtained.

Manufacturing steps of the color filters and the polarization separators will now be described. FIGS. 17A to 17F are diagrams for explaining the steps of forming the color filters and the polarization separators onto the second substrate 90. The forming steps of the color filters and the polarization separators will now be described hereinbelow with reference to the drawings.

[FIG. 17A]

The BM layer 80 made of metal chromium, chromium oxide, or a photoresist resin in which pigment having light absorbing property has been dispersed is pattern-formed onto the transparent and flat second substrate 90 which is optically isotropic.

[FIG. 17B]

Color filters for transmitting the lights of the colors of R, G, and B are pattern-formed onto the substrate 90 formed with the BM layer by the well-known technique ("Technique of Liquid Crystal Display of Next Generation", edited and written by Tatsuo Uchida, Kogyo Chosakai Publishing CO., LTD.) such as dying method, pigment-dispersed photolithography method, printing method, or the like.

[FIG. 17C]

An overcoating layer 910 made of a transparent resin material is further formed onto the color filter pattern.

[FIG. 17D]

A polyvinyl alcohol layer is formed as an alignment layer (not shown) onto the overcoating layer 910. In a manner similar to the foregoing embodiment, a solution of liquid crystal polymer is coated onto the rubbed treatment surface of a polyvinylalcohol layer, the layer of liquid crystal polymer is dried and subjected to the thermal alignment process at 160° C. for 5 minutes. After that, it is left and cooled at a room temperature, thereby obtaining the non-fluid cholesteric liquid crystal layer 500B having the center wavelength of the selective reflection in blue.

[FIG. 17E]

Subsequently, ultraviolet rays are irradiated onto the regions which should indicate the selective reflection of green and red of the non-fluid liquid crystal layer 500B through the photomask 550 having two regions of a transmittance 100% and a transmittance 0%, that is, to the position corresponding to the color filter 900G for transmitting the green light and the position corresponding to the color filter 900R for transmitting the red light. The layer is subjected again to the thermal alignment process at 160° C. for 5 minutes. After that, it is left and cooled at a room temperature, thereby obtaining the pattern-formed non-fluid cholesteric liquid crystal layer 500G having a center wavelength of the selective reflection in green.

[FIG. 17F]

Further, ultraviolet rays are irradiated onto the region which should indicate the selective reflection of red through the photomask 551, that is, at the position corresponding to the color filter 900R for transmitting the red light. After that, the layer is subjected again to the thermal alignment process at 160° C. for 5 minutes and it is left and cooled at a room temperature, thereby obtaining the pattern-formed cholesteric liquid crystal layer 500R having a center wavelength of the selective reflection in red. Thus, the cholesteric liquid crystal layers which were pattern-formed to the R reflection, G reflection, and B reflection are formed. Transparent protection layers can be also provided for the cholesteric liquid crystal layers as necessary.

As mentioned above, the second substrate 90 formed with the BM layer, the color filters, and the polarization separators 500 comprising the cholesteric liquid crystal layers are overlaid in a manner such that the surface on which the polarization separators 500 have been formed faces the surface on which the organic layers 110W of the first substrate 6 have been formed. In this instance, the first substrate 6 and second substrate 90 are positioned so that the position of the pattern-formed organic layers 110W is almost matched with the position of the pattern-formed cholesteric liquid crystal layers and, thereafter, the whole surfaces of them are hermetically adhered with a transparent adhesive agent, or hermetically adhered with a frame-shaped sealing member surrounding the display area in a state where a space is sealed with nitrogen.

With respect to the matching of the positions of the pattern-formed organic layers and the pattern-formed polarization separators, the cholesteric liquid crystal layer having a wavelength of the selective reflection in red and the red color filter are arranged at the position of the organic layer of the pixel in which the red color should be displayed, the cholesteric liquid crystal layer having a wavelength of the selective reflection in green and the green color filter are arranged at the position of the organic layer of the pixel in which the green color should be displayed, and the cholesteric liquid crystal layer having a wavelength of the selective reflection in blue and the blue color filter are arranged at the position of the organic layer of the pixel in which the blue color should be displayed.

The phase plate 700 and polarizer 600 are adhered onto the surface of the second substrate 90 opposite to the surface on which the polarization separators 500 have been formed so as to be optically coupled with the acrylic transparent adhesive agent.

The operation of the display will now be described. The light-emitting operation of the display is the same as that in the foregoing embodiment. That is, the light-emission amount of the pixel is controlled by applying the voltage corresponding to the image information to the data line synchronously with the timing when the turn-on voltage is applied to the gate line corresponding to the pixel whose light-emission amount should be controlled. A desired image is displayed by controlling the light-emission amount of a plurality of pixels constructing the display area in accordance with the image information.

The light emitted from the organic layers 110W is directly incoming into the polarization separators or is reflected by the cathode and, thereafter, incoming therein. The polarization separators are constructed by pattern-forming the cholesteric liquid crystal layers having the wavelength of the selective reflection in the color light which should be displayed by each pixel. Therefore, in the light which was emitted from the organic layers 110W of the pixel which should display red and was incoming into the polarization separator 500R, the circularly polarized light components in a predetermined wavelength range corresponding to red and in one rotating direction (for example, levorotatory circularly polarized light here) are reflected and the other light is transmitted due to the selective reflection of the cholesteric liquid crystal layers constructing the polarization separator 500R.

In the light transmitted through the polarization separator 500R, the light in a predetermined wavelength range corresponding to red is only the dextrorotatory circularly polarized light and the light of the other wavelengths is the unpolarized light.

The light transmitted through the polarization separator 500R is incoming into the red color filter 900R and the light out of the predetermined wavelength range corresponding to red is almost absorbed by the red color filter 900R.

In the light transmitted through the polarization separator 500R, the light in the predetermined wavelength range corresponding to red is transmitted through the red color filter 900R, converted from the circularly polarized light into the linearly polarized light due to the operation of the phase plate 700, transmitted through the polarizer 600 without being absorbed by it, and directed toward the viewer 10000.

On the other hand, the light reflected by the polarization separator 500R is reflected by the cathode 300 and directed toward the polarization separator 500R again. However, when it is reflected by the cathode 300, the phase is shifted by π and the reflected light becomes the circularly polarized light in the opposite rotating direction (dextrorotatory circularly polarized light here), so that the light is transmitted through the polarization separator 500R. The light transmitted through the polarization separator 500R is also transmitted through the red color filter 900R, converted into the linearly polarized light which is transmitted through the polarizer 600 due to the operation of the phase plate 700, transmitted through the polarizer 600, and directed toward the viewer 10000.

That is, in the white light emitted from the organic layer 110W corresponding to the pixel for displaying red, only the light in the predetermined wavelength range corresponding to red is directed toward the viewer 10000 without being absorbed by the color filter 900R and polarizer 600, so that the bright red light is obtained.

Also with respect to the white light emitted from the organic layer 110W corresponding to the pixel for displaying green (or blue), similarly, only the light in the predetermined wavelength range corresponding to green (or blue) is directed toward the viewer 10000 without being absorbed by the color filter 900G (or color filter 900B) and polarizer 600, so that the bright green light (or blue light) is obtained.

That is, by effectively using the light which has been absorbed by the polarizer and has become wasteful hitherto, there is an effect such that the luminance of the light-emitting devices is improved and the bright display can be performed.

When the incident ambient light which is incoming into the light-emitting devices of the display under the bright environment passes through the polarizer 600, at least the half of it is absorbed. When the light transmitted through the polarizer 600 is transmitted through the phase plate 700, it is subjected to the operation thereof and becomes the circularly polarized light. When the light passes through the color filter, ⅔ of the light is further absorbed. The light transmitted through the color filter is reflected by the cathode 300 and, further, reflected by the polarization separator. After that, it is reflected by the cathode 300 again, transmitted through the polarization separator, the color filter, phase plate, and polarizer, and directed toward the viewer 10000. Therefore, even under the bright environment, since most of the incident ambient light is cut, there is an effect such that the dark display becomes dark and a high contrast ratio can be realized.

In the case where the center wavelengths of the light emission are equal, generally, when the wavelength range of the light emission shows a narrow peak band, the color purity is enhanced. As for the wavelength distribution of the selective reflection of the cholesteric liquid crystal layer, the wavelength range can be narrowed than the transmission wavelength distribution of the ordinary color filter using the pigment or dye and the wavelength distribution is steeper.

Therefore, according to the light-emitting displays (of the embodiment), as compared with the conventional color display obtained by combining the color filters of R, G, and B to the white light-emitting organic EL devices, the color purity of a sole color of R, G, and B is higher and the display of a wider display color gamut can be realized. Also in the light-emitting displays of the embodiment, naturally, the same effects can be obtained with respect to the structural portions similar to those in the foregoing embodiment.

ANOTHER EMBODIMENT OF THE LIGHT-EMITTING DEVICES

Figure 18:
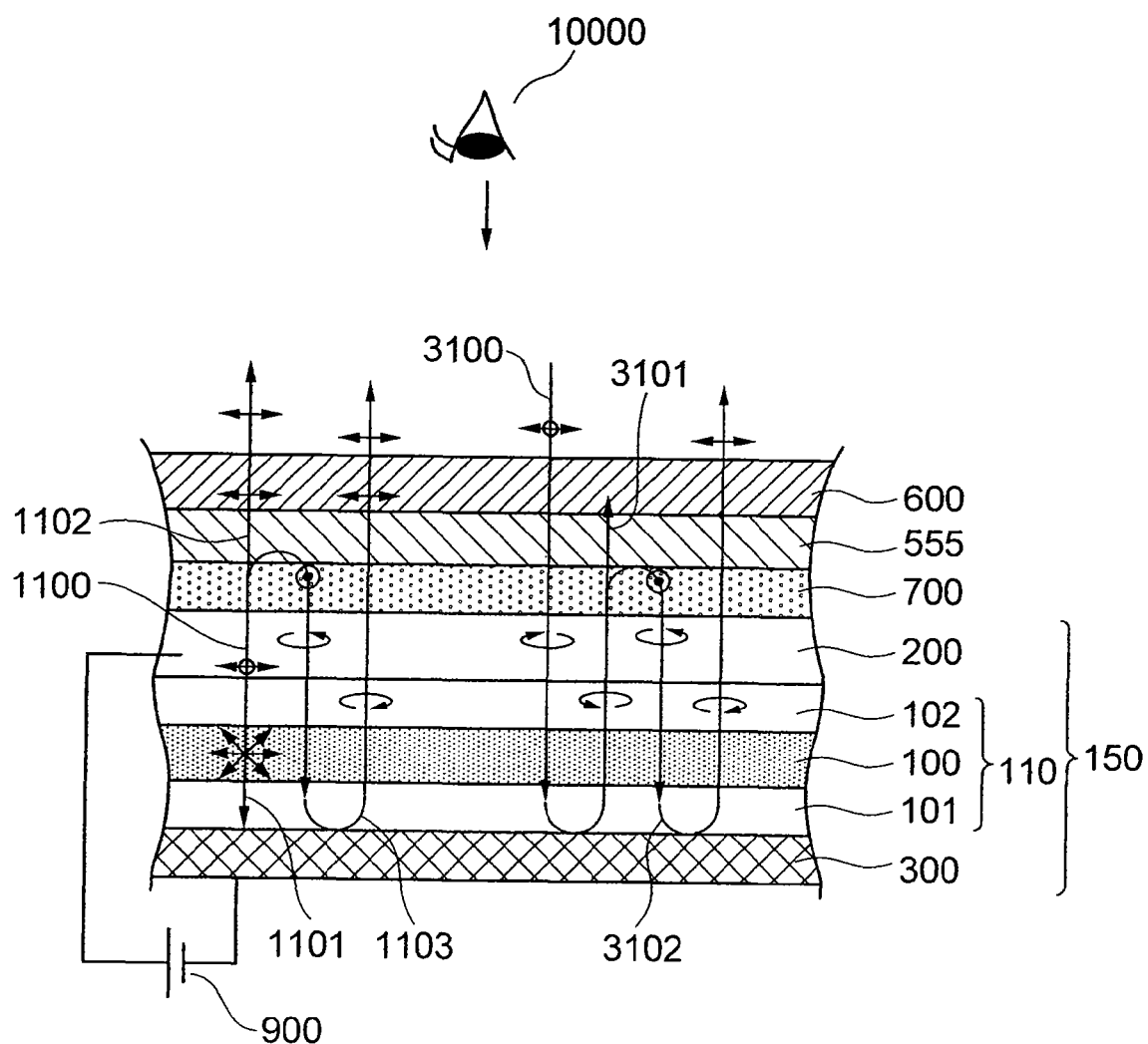
FIG. 18 is a schematic cross sectional view showing a part of light-emitting devices as another embodiment of the invention.
Figure 19:
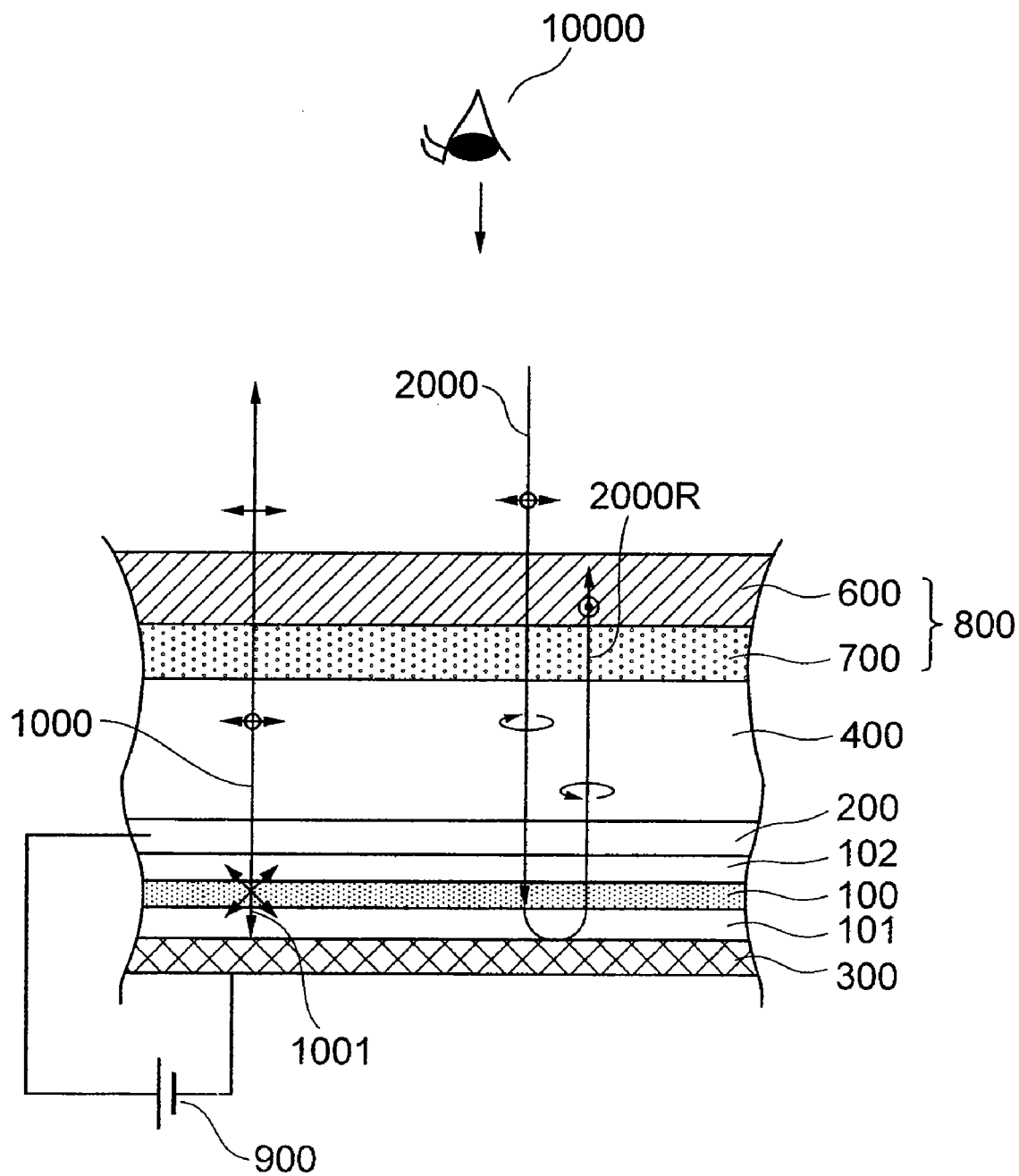
FIG. 19 is a schematic cross sectional view showing a part of conventional light-emitting devices.

Another embodiment of the light-emitting devices in the invention will now be described with reference to the drawings. FIG. 18 is a partial schematic cross sectional view for explaining a fundamental construction and an operation principle in another embodiment of the light-emitting devices in the invention. According to the light-emitting devices, in the embodiment, in place of the cholesteric liquid crystal layers used as polarization separators in the foregoing embodiment, polarization separators (hereinafter, referred to as linear polarization separators) 555 for reflecting the linearly polarized light components in a predetermined wavelength range and transmitting the other components is used. Therefore, portions common to those of the foregoing embodiment are designated by the same reference numerals and their detailed description is omitted here.

As shown in FIG. 18, the light-emitting devices are constructed by: the organic EL device 150 which is formed on a substrate (not shown) and comprises the anode constructed by the transparent electrodes 200, the cathode 300 serving as mirror surface reflecting means, and the organic layer 110 formed between the anode and the cathode; and the phase plate 700, a linear polarization separator 555, and polarizer 600 which are sequentially stacked and arranged from the transparent electrodes 200 side of the organic EL device 150.

The linear polarization separator 555 has a sheet-shape and has a function for reflecting the linearly polarized light components in a predetermined wavelength range in the light which is incoming into the separator 555 and transmitting the other light. Various constructions are considered as a linear polarization separator 555. For example, it is possible to use a birefringent reflective polarizer obtained by alternately stacking a plurality of different birefringent layers disclosed in International Application Publication No. WO95/27919 of the International Application or a polarizer such that two prism array films whose prism apex is almost equal to 90° are joined and a polarization separator layer made by dielectric multilayers is deposited on the mating surfaces as disclosed in SID92 Digest, pp. 427-429. In this instance, the wavelength range for reflecting by the linear polarization separator is allowed to almost coincide with the wavelength range of the light emission of the organic EL device.

As a phase plate 700 and a polarizer 600, it is sufficient to use a phase plate and a polarizer which construct what is called a circular polarizer in the conventional technique. That is, the polarizer 600 transmits a specific linearly polarized light in the light which passes therethrough and absorbs the linearly polarized light which perpendicularly crosses it. As a phase plate 700, a plate which functions as a quarter-wave plate for converting the linearly polarized light which passed through the polarizer 600 into the circularly polarized light is used.

Although the linear polarization separator 555 is arranged between the polarizer 600 and phase plate 700 constructing the circular polarizer, in this instance, it is arranged so that a transmission polarization axis of the linearly polarized light of the linear polarization separator 555 coincides with a transmission polarization axis of the linearly polarized light of the polarizer 600.

The operation of the present light-emitting device will now be described with reference to FIG. 18. The DC power source 900 is connected to the transparent electrodes 200 and cathode 300. By applying a DC voltage between the transparent electrodes 200 and cathode 300, a light emission of a predetermined wavelength is caused from the emissive layer 100. In the light emitted from the emissive layer 100, light 1100 directing toward the transparent electrodes 200 side is transmitted as it is through the transparent electrodes 200 and phase plate 700 and incoming into the linear polarization separator 555.

In the light emitted from the emissive layer 100, light 1101 directing toward the cathode 300 side is reflected by the cathode 300, transmitted through the transparent electrodes 200 and phase plate 700 likewise, and incoming into the linear polarization separator 555. At this time, since the light which was emitted from the emissive layer 100 and is incoming into the linear polarization separator 555 is the unpolarized light, the linearly polarized light components which should be absorbed by the polarizer 600 are reflected and the linearly polarized light components which are transmitted through the polarizer 600 are transmitted. Light 1102 transmitted through the polarization separator 555 is transmitted through the polarizer 600 and directed toward the viewer 10000.

A linearly polarized light 1103 reflected by the linear polarization separator 555 passes through the phase plate 700 and is directed toward the cathode 300. However, when the light passes through the phase plate 700, it is subjected to the operation thereof and converted into the circularly polarized light (for example, levorotatory circularly polarized light here). When the light 1103 directing toward the cathode 300 is reflected by the cathode 300, the phase is shifted by $\pi$ and the reflected light becomes the circularly polarized light in the direction opposite to the above rotating direction (for example, dextrorotatory circularly polarized light). When, the light passes through the phase plate 700 again, it is subjected to the operation thereof and converted into the linearly polarized light which is transmitted through the linear polarization separator 555. Therefore, the light is transmitted through the linear polarization separator 555 and polarizer 600 and directed toward the viewer 10000.

That is, according to the light-emitting devices, in the light emitted from the emissive layer 100, since the light which has been absorbed by the polarizer and has become the loss hitherto is effectively reused, there is an effect such that the amount of light directing toward the viewer 10000 is increased and the luminance is improved.

The action of the external light which is incoming from the outside into the light-emitting devices under the environment of the bright ambience will now be described. Although an incident ambient light 3100 which is incoming from the ambience into the light-emitting devices is the unpolarized light, when it passes through the polarizer 600, a predetermined linearly polarized light is absorbed and only the linearly polarized light which perpendicularly crosses it is transmitted. The linearly polarized light transmitted through the polarizer 600 is also transmitted through the linear polarization separator 555, is subjected to the operation of the phase plate 700, and becomes the circularly polarized light (for example dextrorotatory circularly polarized light here).

When the light which passed through the phase plate 700 is reflected by the cathode 300, the phase is shifted by $\pi$ and the reflected light becomes the circularly polarized light in the opposite rotating direction (levorotatory circularly polarized light). When the light reflected by the cathode 300 passes through the phase plate 700 again, it is converted into the linearly polarized light which is absorbed by the polarizer 600 and, thereafter, incoming into the linear polarization separator 555. The linear polarization separator 555 reflects the light in the wavelength range corresponding to the light-emission wavelength range of the organic EL device and transmits the light of the other wavelengths. Since light 3101 transmitted through the linear polarization separator 555 is absorbed by the polarizer 600, it is not returned to the outside.

When light 3102 reflected by the linear polarization separator 555 passes through the phase plate 700, it is subjected to the operation thereof and converted into the levorotatory circularly polarized light. When it is reflected again by the cathode 300, the phase is shifted by $\pi$ and the reflected light becomes the dextrorotatory circularly polarized light in the opposite rotating direction. When the light reflected again by the cathode 300 passes through the phase plate 700, it is converted into the linearly polarized light which passes through the polarizer 600. Therefore, it is transmitted through the linear polarization separator 555 and polarizer 600 and directed toward the viewer 10000.

That is, at least the half of the incident ambient light 3100 (incoming into the light-emitting devices) is absorbed by the polarizer 600. The light transmitted through the polarizer 600 is transmitted through the linear polarization separator 555, phase plate 700, and the like, reflected by the cathode 300, and incoming again into the linear polarization separator 555. However, the light 3101 transmitted through the linear polarization separator 555 is absorbed by the polarizer 600. Therefore, the light which is emitted outside is only the light 3102 of a small amount in the wavelength range which is reflected by the linear polarization separator 555. That is, even in the light-emitting devices of the invention, in a manner similar to the above embodiment, since most portion of the incident ambient light is cut even under the bright environment, there is an effect such that the dark display becomes dark and a high contrast ratio can be realized.

By setting the reflection wavelength range of the linearly polarized light of the linear polarization separator 555 to be narrower than the wavelength range of the light emission of the organic EL device, there are effects such that the color purity of the color light directing toward the viewer 10000 can be improved and the contrast ratio under the bright environment can be further improved.

As mentioned above, according to the embodiments of the invention, according to the light-emitting devices, due to the operation of the polarization separators comprising the cholesteric liquid crystal layers or the like, by effectively reusing the light which has been absorbed by the polarizer and has become the loss hitherto, there is an effect such that the amount of light directing toward the viewer increases and the luminance is improved. Furthermore, by controlling the wavelength range of the light which is reflected by the polarization separators and reused, there is an effect such that the color light of the color purity higher than that of the light emission itself from the emissive layer is obtained.

Further, since most portion of the reflection of the incident ambient light is cut even under the bright environment, there is an effect such that the black display becomes dark and a high contrast ratio can be realized.

According to the embodiments of the invention, according to the light-emitting displays, since the light-emitting devices constructing the displays can also use the light which has been absorbed by the polarizer and has become the loss hitherto as display light due to the operation of the polarization separators, the luminance is improved.

Therefore, in case of the same electric power consumption, there is an effect such that the light-emitting displays of the higher luminance and the bright display can be realized, or in case of the same luminance (brightness), there is an effect such that the light-emitting displays of the low electric power consumption and, further, the long lifetime can be realized.

Further, according to the embodiments of the invention, in the light-emitting displays, since the color purity of the color light which is emitted from the light-emitting devices constructing the displays is high, there is an effect such that the display of high quality in which the color gamut of the display is wide can be realized.

Further, according to the embodiments of the invention, in the light-emitting displays, since each pixel is optically separated by the partition having the light absorbing property provided around the light-emitting devices of each pixel, there is an effect such that the display of high quality without a color mixture and a blooming can be obtained. In the light-emitting displays of the invention, since no substrate exists between the organic EL device and the polarization separators, there is an effect such that the use efficiency of the light is improved and, further, the display of high quality without a color mixture and a blooming can be obtained.

What is claimed is:

1. A light-emitting device comprising:
   a substrate;
   an organic electroluminescence device formed on the substrate;
   a transparent insulation layer formed directly on the organic electroluminescence device;
   a polarization separator formed directly on the transparent insulation layer;
   a phase plate formed on the polarization separator; and
   a polarizer formed on the phase plate,
   wherein the organic electroluminescence device comprises:
      a first electrode;
      a second electrode; and
      an organic emissive layer sandwiched by the first and second electrodes,
      wherein the second electrode is an optically transparent electrode formed on the organic emissive layer opposite side to the substrate; and
   wherein the polarization separator reflects a specific light among light traveling from an emissive layer side to a polarization separator side and transmits remaining light, the specific light has a wavelength range that is narrower than a light emission range of the emissive layer, and when converted into linear polarized light by the phase plate, the specific light includes a circular polarized light component to be absorbed by the polarizer, and the first electrode includes a reflective surface for reflecting circular polarized light impinging vertically on the reflective surface as a circular polarized light of which direction of rotation is reversed.

2. A light-emitting device according to claim 1, wherein the first electrode is a cathode, and the second electrode is an anode.

3. A light-emitting device according to claim 1, wherein the transparent insulation layer is a planarization layer.

4. A light-emitting device according to claim 1, wherein the polarization separator is a cholesteric liquid crystal layer.

5. A light-emitting device according to claim 1, further comprising an active matrix connected to the first electrode, wherein the active matrix is formed between the substrate and the organic electroluminescence device.

6. An organic electroluminescence display comprising a light-emitting device according to claim 1, wherein the light-emitting device comprises:
   an active matrix formed between the substrate and the organic electroluminescence device;
   the emissive layer;
   the first electrode which has the shapes of islands; and
   the second electrode formed on the whole surface,
   wherein the first electrode is connected to the active matrix.

7. An organic electroluminescence display of an active matrix driving type, comprising:
   a plurality of light-emitting devices arranged in a matrix form;
   a partition dividing the light-emitting devices; and
   a black matrix formed on the partition and disposed at an upper layer of a transparent electrode,
   wherein the black matrix is narrower than the partition.

8. An organic electroluminescence display of an active matrix driving type, comprising:
   a plurality of light-emitting devices arranged in a matrix form;
   a partition dividing the light-emitting devices;
   a black matrix formed on the partition, and
   a planarization layer disposed between the black matrix and the partition,
   wherein the black matrix is narrower than the partition.

* * * * *